(12) United States Patent
Mizuta et al.

(10) Patent No.: US 10,692,910 B2
(45) Date of Patent: Jun. 23, 2020

(54) SOLID-STATE IMAGING ELEMENT AND ELECTRONIC DEVICE

(71) Applicant: SONY CORPORATION, Tokyo (JP)

(72) Inventors: Kyohei Mizuta, Kanagawa (JP);
Takuya Maruyama, Kanagawa (JP);
Yukihiro Ando, Kanagawa (JP)

(73) Assignee: SONY CORPORATION, Tokyo (JP)

(*) Notice: Subject to any disclaimer, the term of this patent is extended or adjusted under 35 U.S.C. 154(b) by 0 days.

(21) Appl. No.: 16/081,651

(22) PCT Filed: Mar. 1, 2017

(86) PCT No.: PCT/JP2017/008050
§ 371 (c)(1),
(2) Date: Aug. 31, 2018

(87) PCT Pub. No.: WO2017/159361
PCT Pub. Date: Sep. 21, 2017

(65) Prior Publication Data
US 2019/0088701 A1 Mar. 21, 2019

(30) Foreign Application Priority Data
Mar. 15, 2016 (JP) .................. 2016-050964

(51) Int. Cl.
*H01L 27/14* (2006.01)
*H01L 27/146* (2006.01)

(52) U.S. Cl.
CPC .... *H01L 27/14623* (2013.01); *H01L 27/1463* (2013.01); *H01L 27/1464* (2013.01);
(Continued)

(58) Field of Classification Search
CPC .................................. H01L 27/1463
See application file for complete search history.

(56) References Cited

U.S. PATENT DOCUMENTS 9,929,200 B2 * 3/2018 Sato .................. H01L 27/14634
10,412,287 B2 * 9/2019 Masuda ............. H01L 27/1463
(Continued)

FOREIGN PATENT DOCUMENTS

| CN | 2012-169530 A | 9/2012 |
|---|---|---|
| CN | 103000644 A | 3/2013 |

(Continued)

OTHER PUBLICATIONS

International Search Report and Written Opinion of PCT Application No. PCT/JP2017/008050, dated May 16, 2017, 11 pages of ISRWO.

*Primary Examiner* — Caridad Everhart
*Assistant Examiner* — Ankush K Singal
(74) *Attorney, Agent, or Firm* — Chip Law Group

(57) ABSTRACT

The present disclosure relates to a solid-state imaging element capable of suppressing stray light with respect to a charge storage unit such as an FD, and an electronic device. According to an aspect of the present disclosure, a solid-state imaging element constituted by many pixels includes a photoelectric conversion unit formed for each of the pixels and that converts incident light into a charge; a charge storage unit that temporarily holds the converted charge; and a first light shielding unit formed between the pixels and having a predetermined length in a thickness direction of a substrate. The charge storage unit is formed below a cross portion where the first light shielding unit formed between pixels adjacent to each other in a longitudinal direction crosses the first light shielding unit formed between pixels adjacent to each other in a lateral direction. The present disclosure can be applied to, for example, a backside irradiation type CMOS image sensor.

19 Claims, 32 Drawing Sheets

(52) U.S. Cl.
CPC .. *H01L 27/14603* (2013.01); *H01L 27/14612* (2013.01); *H01L 27/14614* (2013.01); *H01L 27/14645* (2013.01)

(56) References Cited

U.S. PATENT DOCUMENTS

| | | |
|---|---|---|
| 2011/0019050 A1 | 1/2011 | Yamashita |
| 2012/0032241 A1 | 2/2012 | Huang et al. |
| 2012/0037960 A1* | 2/2012 | Yokoyama ........ H01L 27/14623 257/230 |
| 2012/0147208 A1* | 6/2012 | Otsuka ............. H01L 27/14621 348/222.1 |
| 2013/0070131 A1 | 3/2013 | Ohkubo et al. |
| 2013/0134536 A1* | 5/2013 | Mori ................. H01L 27/1462 257/432 |
| 2014/0054662 A1 | 2/2014 | Yanagita et al. |
| 2014/0131779 A1 | 5/2014 | Takeda |
| 2014/0327051 A1 | 11/2014 | Ahn et al. |
| 2014/0346628 A1 | 11/2014 | Okazaki |
| 2015/0069471 A1 | 3/2015 | Kawamura |
| 2015/0091122 A1 | 4/2015 | Okazaki et al. |
| 2015/0102448 A1* | 4/2015 | Sato ................. H01L 27/14634 257/446 |
| 2016/0112614 A1 | 4/2016 | Masuda et al. |
| 2019/0035839 A1* | 1/2019 | Byun ................. H01L 27/1463 |

FOREIGN PATENT DOCUMENTS

| | | |
|---|---|---|
| CN | 103403869 A | 11/2013 |
| CN | 103811507 A | 5/2014 |
| CN | 104183611 A | 12/2014 |
| CN | 104303305 A | 1/2015 |
| CN | 104425535 A | 3/2015 |
| CN | 105229790 A | 1/2016 |
| CN | 106416227 A | 2/2017 |
| JP | 2009-206356 A | 9/2009 |
| JP | 2012-169530 A | 9/2012 |
| JP | 2013-065688 A | 4/2013 |
| JP | 2013-175494 A | 9/2013 |
| JP | 2013-243324 A | 12/2013 |
| JP | 2014-096490 A | 5/2014 |
| JP | 2014-229810 A | 12/2014 |
| JP | 2015-023259 A | 2/2015 |
| JP | 2015-029054 A | 2/2015 |
| JP | 2015-053411 A | 3/2015 |
| JP | 2015-231051 A | 12/2015 |
| KR | 10-2014-0015326 A | 2/2014 |
| KR | 10-2014-0130969 A | 11/2014 |
| KR | 10-2015-0027044 A | 3/2015 |
| KR | 10-2016-0029735 A | 3/2016 |
| TW | 201001683 A | 1/2010 |
| WO | 2009/107755 A1 | 9/2009 |
| WO | 2012/117931 A1 | 9/2012 |
| WO | 2013/175742 A1 | 11/2013 |
| WO | 2015/001987 A1 | 1/2015 |
| WO | 2015/186509 A1 | 12/2015 |

* cited by examiner

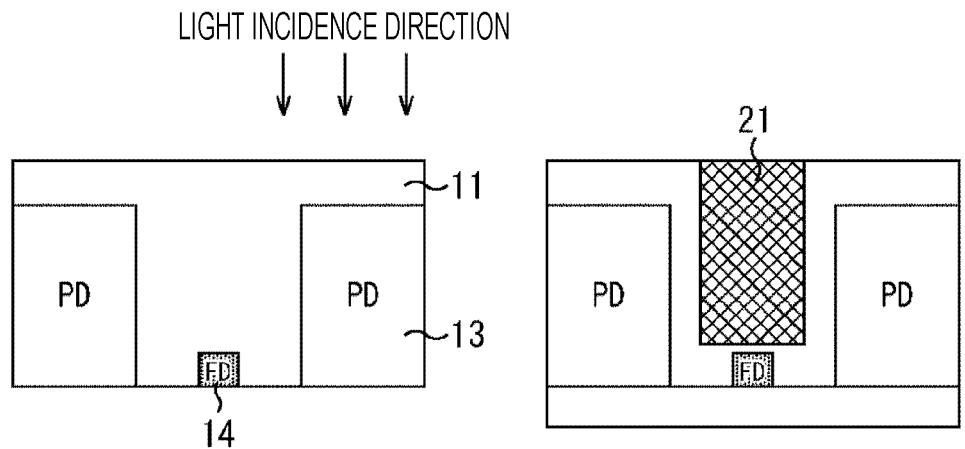
FIG. 4A
FIG. 4D
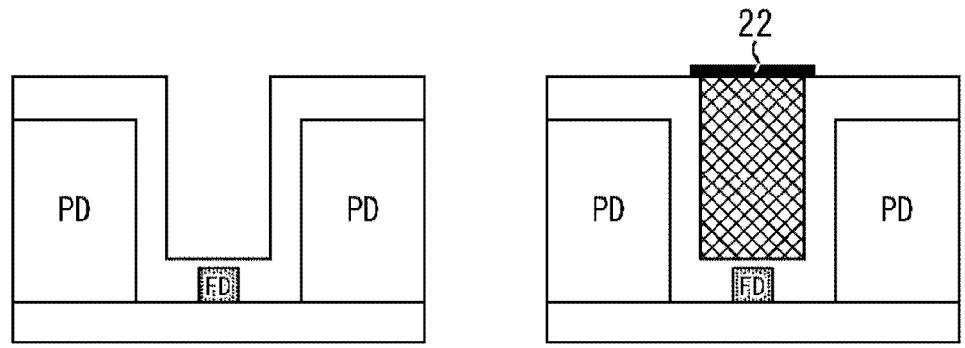
FIG. 4B
FIG. 4E
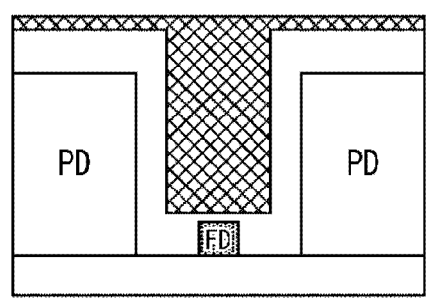
FIG. 4C

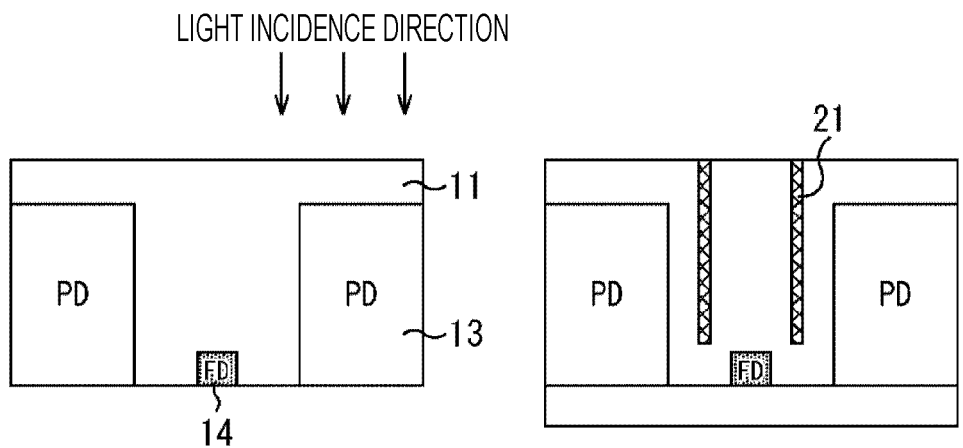
FIG. 9A
FIG. 9D
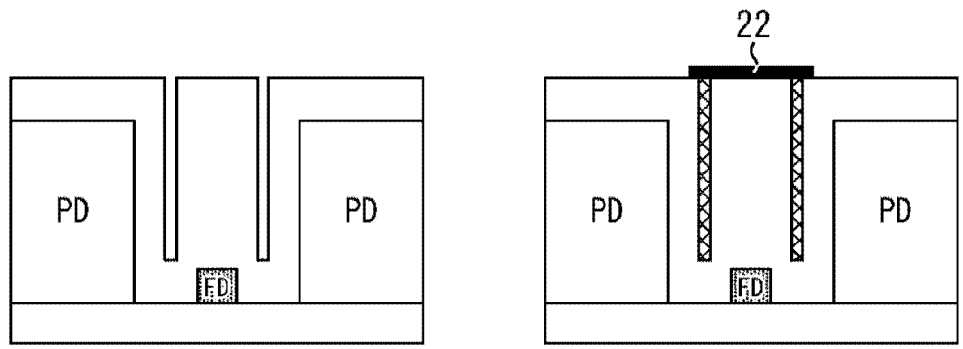
FIG. 9B
FIG. 9E
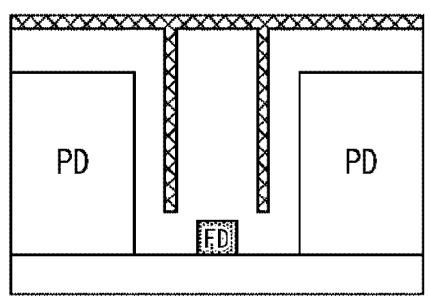
FIG. 9C

LIGHT INCIDENCE DIRECTION

LIGHT INCIDENCE DIRECTION

FIG. 25
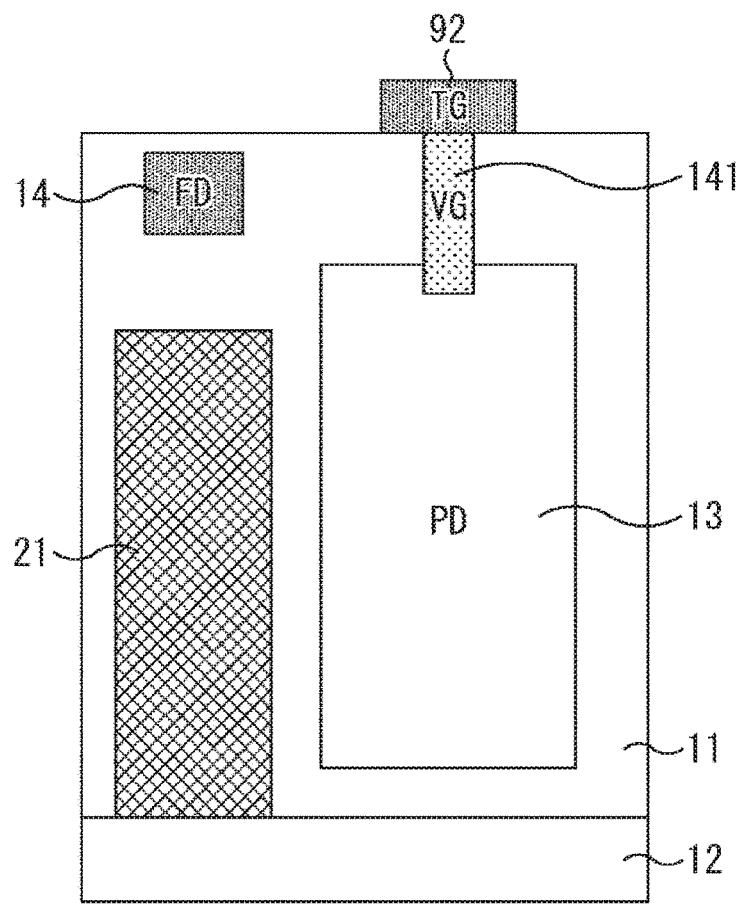
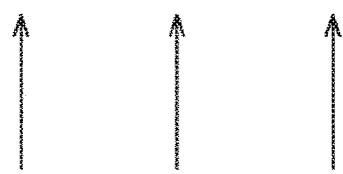
LIGHT INCIDENCE DIRECTION

SOLID-STATE IMAGING ELEMENT AND ELECTRONIC DEVICE

CROSS REFERENCE TO RELATED APPLICATIONS

This application is a U.S. National Phase of International Patent Application No. PCT/JP2017/008050 filed on Mar. 1, 2017, which claims priority benefit of Japanese Patent Application No. JP 2016-050964 filed in the Japan Patent Office on Mar. 15, 2016. Each of the above-referenced applications is hereby incorporated herein by reference in its entirety.

TECHNICAL FIELD

The present disclosure relates to a solid-state imaging element and an electronic device, and particularly to a solid-state imaging element suppressing stray light with respect to a floating diffusion (FD) or the like that temporarily holds a charge generated by a photoelectric conversion unit, and an electronic device.

BACKGROUND ART

Conventionally, in a case where a global shutter is realized in a solid-state imaging element typified by a CMOS, a method for temporarily holding a charge photoelectrically converted by a photodiode (PD) or the like in a charge storage unit such as an FD and then reading out the charge is known.

In addition, in order to suppress stray light with respect to an FD, a configuration is known in which the FD is disposed below a light shielding wall disposed between pixels (in a light incidence direction) (see, for example, Patent Document 1).

FIG. 1 is a cross-sectional view illustrating an example of a configuration of a conventional solid-state imaging element in which an FD is disposed below a light shielding wall.

In the solid-state imaging element 10, a light shielding wall 16 in which a metal material or the like is embedded is formed between pixels of an Si substrate 11. A PD 13 is formed inside each pixel region of the Si substrate 11, and an FD 14 is formed below the light shielding wall 16 (in a light incidence direction). In addition, a color filter 12 and an on-chip lens (not illustrated) are formed above the Si substrate 11.

In the solid-state imaging element 10, light condensed by the on-chip lens and incident on the PD 13 via the color filter 12 is converted into a charge. The converted charge is accumulated in the FD 14 and then read out at a predetermined timing and converted into a pixel signal.

CITATION LIST

Patent Document

Patent Document 1: Japanese Patent Application Laid-Open No. 2014-96490

SUMMARY OF THE INVENTION

Problems to be Solved by the Invention

In such a configuration as illustrated in FIG. 1, light shielding against the FD 14 may be insufficient, and the FD itself may perform photoelectric conversion in accordance with stray light, thereby generating a false signal.

The present disclosure has been achieved in view of such circumstances, and makes it possible to further suppress stray light with respect to a charge storage unit such as an FD than related art.

Solutions to Problems

A solid-state imaging element according to a first aspect of the present disclosure is constituted by many pixels and includes: a photoelectric conversion unit formed for each of the pixels and configured to convert incident light into a charge; a charge storage unit configured to temporarily hold the converted charge; and a first light shielding unit formed between the pixels and having a predetermined length in a thickness direction of a substrate, in which the charge storage unit is formed below a cross portion where the first light shielding unit formed between pixels adjacent to each other in a longitudinal direction crosses the first light shielding unit formed between pixels adjacent to each other in a lateral direction.

The solid-state imaging element according to the first aspect of the present disclosure may further include a second light shielding unit covering a light incident surface side of the cross portion.

The cross portion may be formed in a columnar shape or a polygonal pillar shape.

The cross portion may be formed in a cylindrical shape or a polygonal tubular shape.

The charge storage unit may be extended in a thickness direction of a substrate in a tube of the cross portion formed in a tubular shape.

The first light shielding unit and the cross portion may be formed individually at different etching rates.

The solid-state imaging element according to the first aspect of the present disclosure may further include a TG transistor, an AMP transistor, a SEL transistor, an OFG transistor, and an RST transistor, and the charge storage unit and a source of the RST transistor may be integrally formed.

The solid-state imaging element according to the first aspect of the present disclosure may further include an FBEN transistor for suppressing reset noise.

A drain of the AMP transistor and a drain of the RST transistor may share a wire and be connected to VDD.

The solid-state imaging element according to the first aspect of the present disclosure may further include a moth eye structure unit for irregularly reflecting incident light to the photoelectric conversion unit.

In the first light shielding unit, lengths in a planar direction of a substrate in adjacent pixel regions may be different from each other.

In the first light shielding unit, lengths in a thickness direction of a substrate in adjacent pixel regions may be different from each other.

The photoelectric conversion unit of one pixel may have a different volume from the photoelectric conversion unit of a pixel adjacent thereto.

The pixel may include at least a first pixel sensitive to light having a first wavelength, a second pixel sensitive to a second wavelength longer than the first wavelength, and a third pixel sensitive to a third wavelength longer than the second wavelength.

In the first light shielding unit formed between the first or second pixel and the third pixel, the length in a planar direction of a substrate in a region of the third pixel may be longer than that in a region of the first or second pixel.

In the first light shielding unit formed between the first or second pixel and the third pixel, the length in a thickness direction of a substrate in a region of the third pixel may be longer than that in a region of the first or second pixel.

The photoelectric conversion unit of the third pixel may have a smaller volume than the photoelectric conversion unit of the first or second pixel.

The charge storage unit formed between the first or second pixel and the third pixel may be formed at a position close to the first or second pixel side.

The charge storage unit may be shared by a plurality of pixels.

An electronic device according to a second aspect of the present disclosure has a solid-state imaging element constituted by many pixels mounted thereon, in which the solid-state imaging element includes: a photoelectric conversion unit formed for each of the pixels and configured to convert incident light into a charge; a charge storage unit configured to temporarily hold the converted charge; and a first light shielding unit formed between the pixels and having a predetermined length in a thickness direction of a substrate, and the charge storage unit is formed below a cross portion where the first light shielding unit formed between pixels adjacent to each other in a longitudinal direction crosses the first light shielding unit formed between pixels adjacent to each other in a lateral direction.

Effects of the Invention

According to the first and second aspects of the present disclosure, it is possible to suppress stray light with respect to the photoelectric conversion unit and to reduce generation of a false signal.

BRIEF DESCRIPTION OF DRAWINGS

FIGS. 4A, 4B, 4C, 4D, and 4E are views for explaining a manufacturing process of the first configuration example of the solid-state imaging element.

FIGS. 9A, 9B, 9C, 9D, and 9E are views for explaining a manufacturing process of the second configuration example of the solid-state imaging element.

FIG. 25 is a cross-sectional view illustrating a modified example of the third configuration example of the solid-state imaging element.

MODE FOR CARRYING OUT THE INVENTION

Hereinafter, best modes (hereinafter referred to as embodiments) for carrying out the present disclosure will be described in detail with reference to the drawings.

First Embodiment

Figure 1:
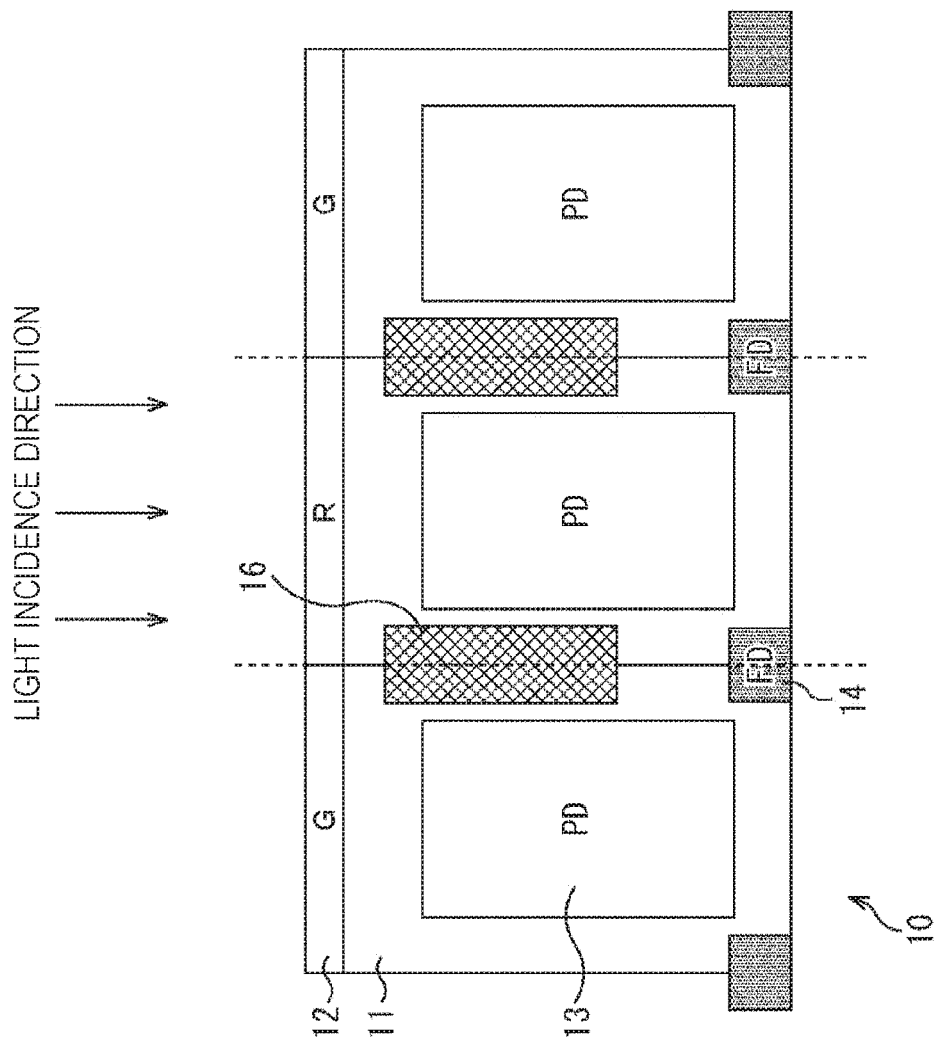
FIG. 1 is a cross-sectional view illustrating a configuration example of a conventional solid-state imaging element.
Figure 2:
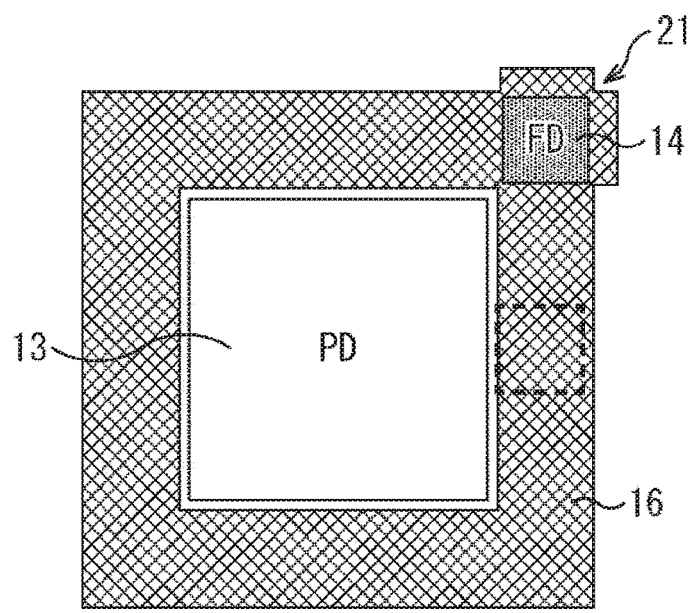
FIG. 2 is a plan view illustrating a first configuration example of a solid-state imaging element to which the present disclosure is applied.

FIG. 2 is a plan view illustrating a first configuration example (first embodiment) of a solid-state imaging element to which the present disclosure is applied. Note that the same reference numerals are given to constituent elements common to those of a conventional solid-state imaging element 10 illustrated in FIG. 1, and therefore description thereof will be omitted appropriately.

In the solid-state imaging element 10, the FD 14 is formed at a position (indicated by a broken line in FIG. 2) below the light shielding wall 16 between adjacent pixels. Meanwhile, in a solid-state imaging element according to a first embodiment, an FD 14 is formed below a position (hereinafter also referred to as a cross portion 21) where light shielding walls 16 between pixels cross each other. In other words, the FD 14 is formed in a diagonal direction of a pixel, that is, below the cross portion 16 formed between adjacent pixels in an oblique direction.

By forming the FD 14 below the cross portion, the position can be further separated from an optical center than the case where the FD 14 is formed below the light shielding wall 16. Therefore, generation of stray light can be further suppressed.

Note that the FD 14 may be disposed for each pixel, or a plurality of pixels may share the FD 14. However, in a case where a plurality of pixels shares the FD 14, in order to realize a global shutter, it is necessary to dispose a charge storage unit such as a memory other than the FD in each pixel.

Figure 3:
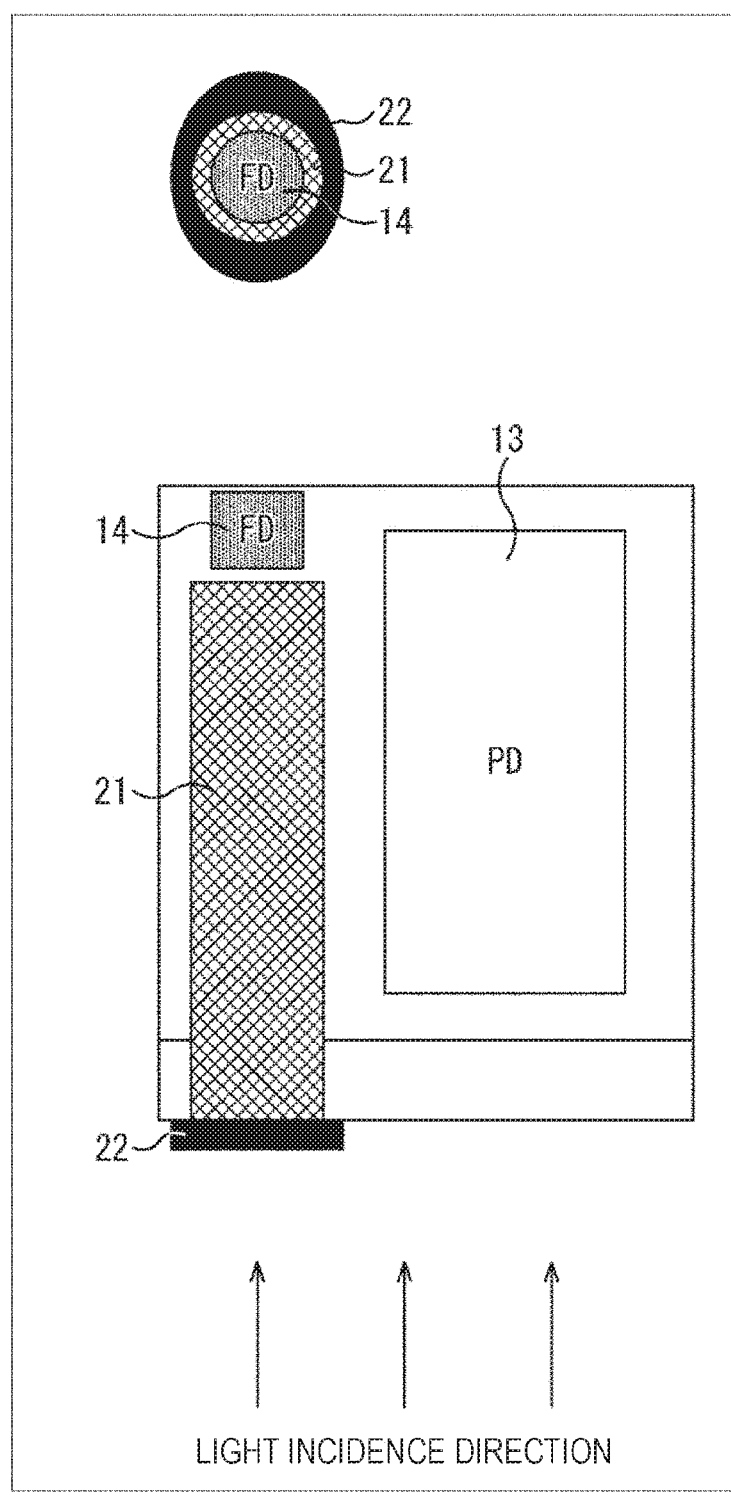
FIG. 3 is a cross-sectional view illustrating the first configuration example of the solid-state imaging element to which the present disclosure is applied.

FIG. 3 illustrates a cross-sectional view of the solid-state imaging element according to the first embodiment, illustrated in FIG. 2. As described above, the FD 14 in the solid-state imaging element according to the first embodiment is formed below the cross portion 21 (as viewed from a light incident surface).

The cross portion 21 is formed in, for example, a columnar shape. However, the cross portion 21 is not limited to a columnar shape, but may be an elliptical columnar shape or a polygonal pillar shape having a quadrangular pillar shape or more.

The light shielding wall 16 and the cross portion 21 are formed by embedding a metal material in a hole opened by etching. Note that an antireflection film material such as an oxide film, an insulating film material, or the like may be embedded instead of the metal material.

Examples of the antireflection film material include hafnium oxide ($HfO_2$), aluminum oxide ($Al_2O_3$), zirconium oxide ($ZrO_2$), tantalum oxide ($Ta_2O_5$), titanium oxide ($TiO_2$), lanthanum oxide ($La_2O_3$), praseodymium oxide ($Pr_2O_3$), cerium oxide ($CeO_2$), neodymium oxide ($Nd_2O_3$), promethium oxide ($Pm_2O_3$), samarium oxide ($Sm_2O_3$), europium oxide ($Eu_2O_3$), gadolinium oxide (($Gd_2O_3$), terbium oxide ($Tb_2O_3$), dysprosium oxide ($Dy_2O_3$), holmium oxide ($Ho_2O_3$), thulium oxide ($Tm_2O_3$), ytterbium oxide ($Yb_2O_3$), lutetium oxide ($Lu_2O_3$), yttrium oxide ($Y_2O_3$), and silicon nitride (SiN).

In a case where the antireflection film material is used, a difference in refractive index from the Si substrate 11 can cause total reflection of light. In addition, the thicknesses of the light shielding wall 16 and the cross portion 21 can be reduced, and therefore an effect of miniaturizing the solid-state imaging element can be expected.

Examples of the insulating film include a Si compound (silicon oxide/silicon nitride/silicon oxynitride/silicon carbide, and the like).

A light shielding cover 22 is formed with a metal material such as tungsten (W) above the cross portion 21 (light incident surface side). The light shielding cover 22 has such a size that the light shielding cover 22 covers the cross portion 21 and does not hinder incidence of light on the PD 13. The shape of the light shielding cover 22 may be any one of a circle, an ellipse, and a polygon having a quadrangular shape or more.

Next, FIGS. 4A, 4B, 4C, 4D, and 4E illustrate a process of manufacturing the solid-state imaging element according to the first embodiment.

First, as illustrated in FIG. 4A, the Si substrate 11 on which the PD 13 and the FD 14 are formed is prepared. Subsequently, as illustrated in FIG. 4B, a pillar-shaped hole is dug in a position to form the light shielding wall 16 and the cross portion 21 by dry etching from the light incident surface side of the Si substrate 11.

Subsequently, as illustrated in FIG. 4C, a metal material, an antireflection film material, or an insulating film material is filled into the dug hole. Thereafter, as illustrated in FIG. 4D, a metal material or the like above the PD 13 is scraped off. Finally, as illustrated in FIG. 4E, the light shielding cover 22 is formed above the cross portion 21. Thereafter, a color filter or an on-chip lens is placed on the light incident surface side of the Si substrate 11.

Figure 5:
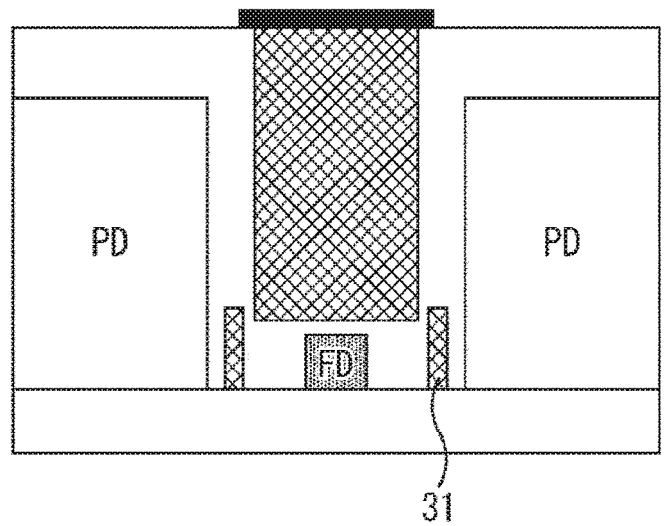
FIG. 5 is a plan view illustrating a modified example of the first configuration example of the solid-state imaging element.
Figure 6:
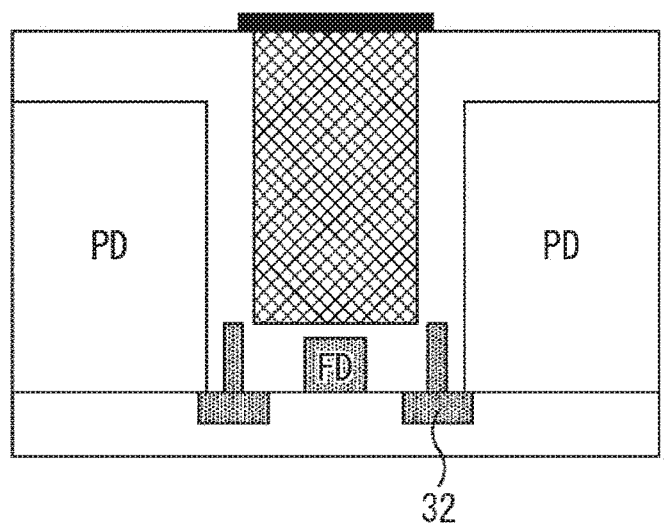
FIG. 6 is a plan view illustrating a modified example of the first configuration example of the solid-state imaging element.
Figure 7:
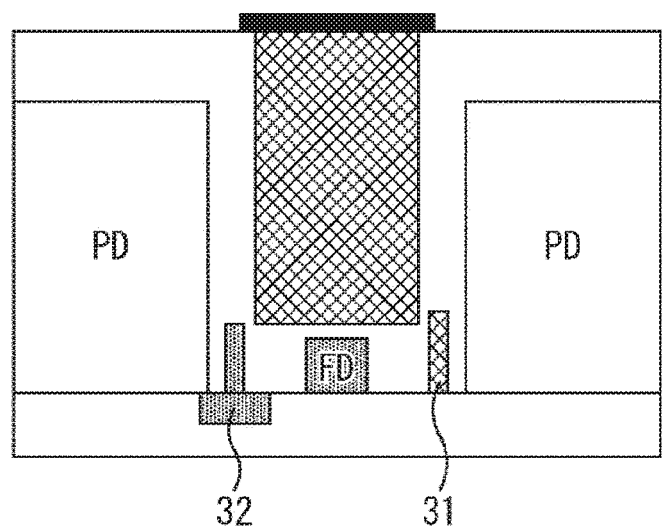
FIG. 7 is a plan view illustrating a modified example of the first configuration example of the solid-state imaging element.

FIGS. 5 to 7 illustrate modified examples of the solid-state imaging element according to the first embodiment.

FIG. 5 illustrates a modified example in which an element isolating portion 31 is added and formed by shallow trench isolation (STI). FIG. 6 illustrates a modified example in which a vertical transistor 32 is added and formed. FIG. 7 illustrates a modified example in which the element isolating portion 31 and the vertical transistor 32 are added and formed.

Second Embodiment

Figure 8:
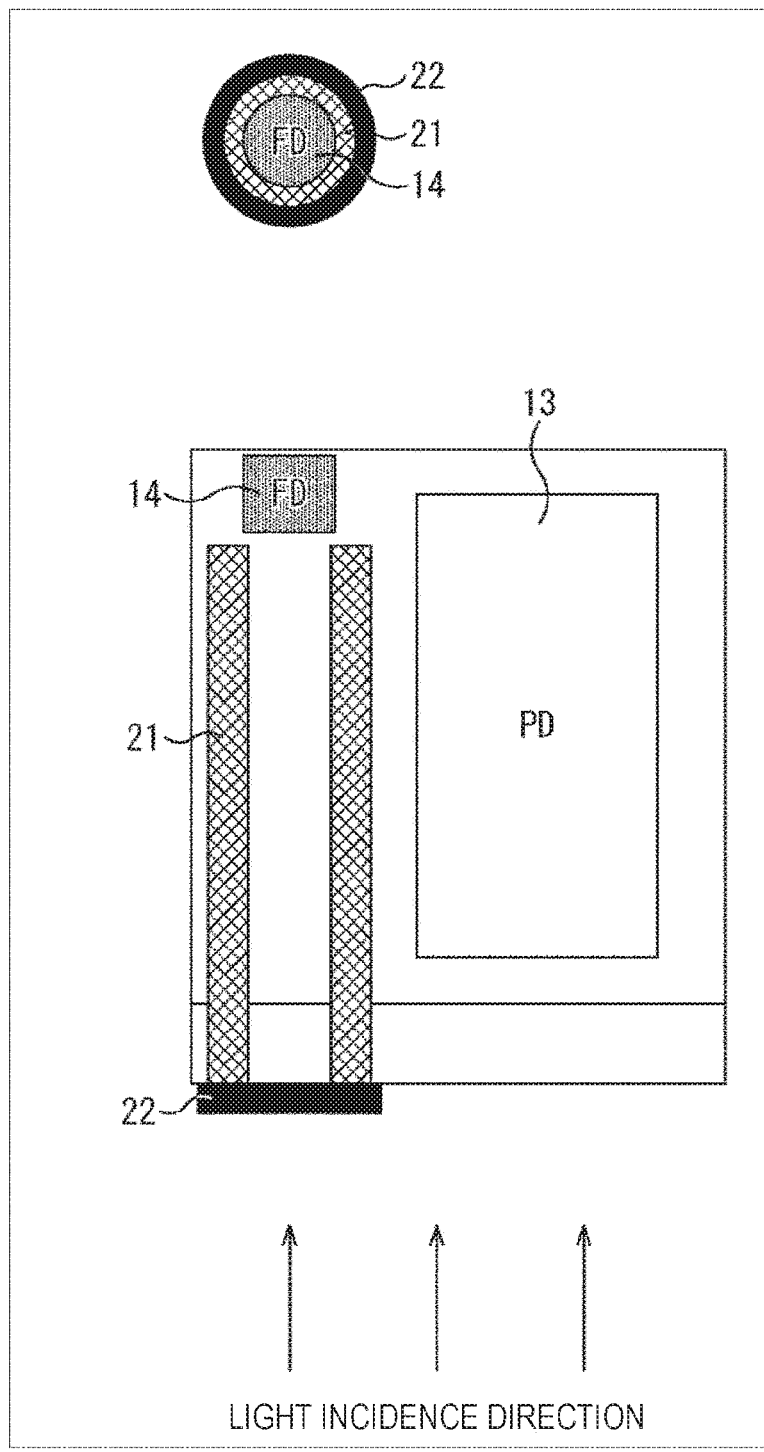
FIG. 8 is a cross-sectional view illustrating a second configuration example of the solid-state imaging element to which the present disclosure is applied.

Next, FIG. 8 illustrates a cross-sectional view of a second configuration example (second embodiment) of the solid-state imaging element to which the present disclosure is applied.

The solid-state imaging element according to the second embodiment is obtained by deforming the cross portion 21 according to the first embodiment, illustrated in FIG. 3, from a column to a cylinder. Note that the cross portion 21 may have a cylindrical shape of an ellipse or a polygon having a quadrangular shape or more.

FIGS. 9A, 9B, 9C, 9D, and 9E illustrate a process of manufacturing the solid-state imaging element according to the second embodiment.

First, as illustrated in FIG. 4A, the Si substrate 11 on which the PD 13 and the FD 14 are formed is prepared. Subsequently, as illustrated in FIG. 9B, a pillar-shaped groove is dug in a position to form a light shielding wall 16 and the cross portion 21 by dry etching from the light incident surface side of the Si substrate 11.

Subsequently, as illustrated in FIG. 9C, a metal material, an antireflection film material, or an insulating film material is filled into the dug groove. Thereafter, as illustrated in FIG. 9D, a metal material or the like above the PD 13 is scraped off. Finally, as illustrated in FIG. 9E, a light shielding cover 22 is formed above the cross portion 21. Thereafter, a color filter or an on-chip lens is placed on the light incident surface side of the Si substrate 11.

FIGS. 10 to 14 illustrate modified examples of the solid-state imaging element according to the second embodiment.

Figure 10:
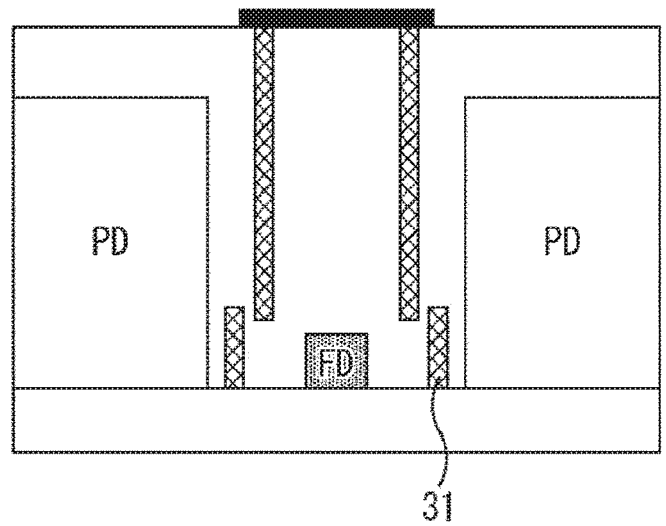
FIG. 10 is a plan view illustrating a modified example of the second configuration example of the solid-state imaging element.
Figure 11:
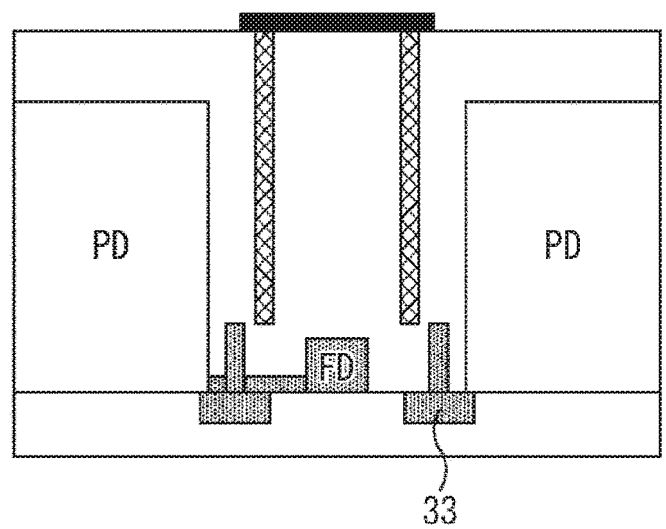
FIG. 11 is a plan view illustrating a modified example of the second configuration example of the solid-state imaging element.
Figure 12:
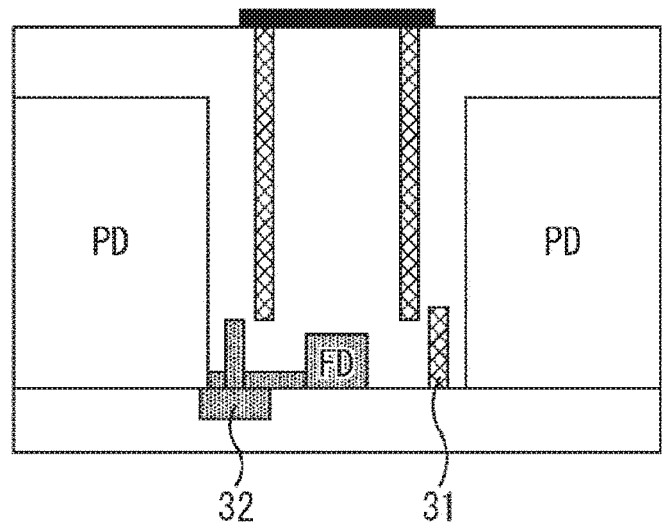
FIG. 12 is a plan view illustrating a modified example of the second configuration example of the solid-state imaging element.
Figure 13:
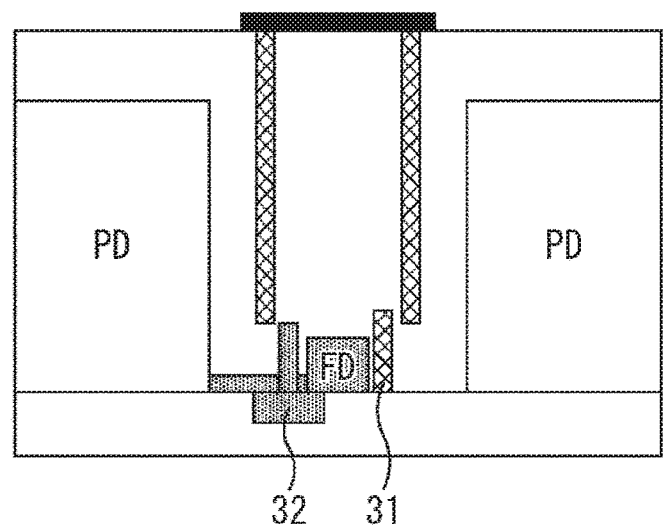
FIG. 13 is a plan view illustrating a modified example of the second configuration example of the solid-state imaging element.

FIG. 10 illustrates a modified example in which an element isolating portion 31 is added and formed by STI outside the tubular cross portion 21. FIG. 11 illustrates a modified example in which a vertical transistor 32 is added and formed outside the tubular cross portion 21. FIG. 12 illustrates a modified example in which the element isolating portion 31 and the vertical transistor 32 are added and formed outside the tubular cross portion 21. FIG. 13 illustrates a modified example in which the element isolating portion 31 and the vertical transistor 32 are added and formed inside the tubular cross portion 21.

Figure 14:
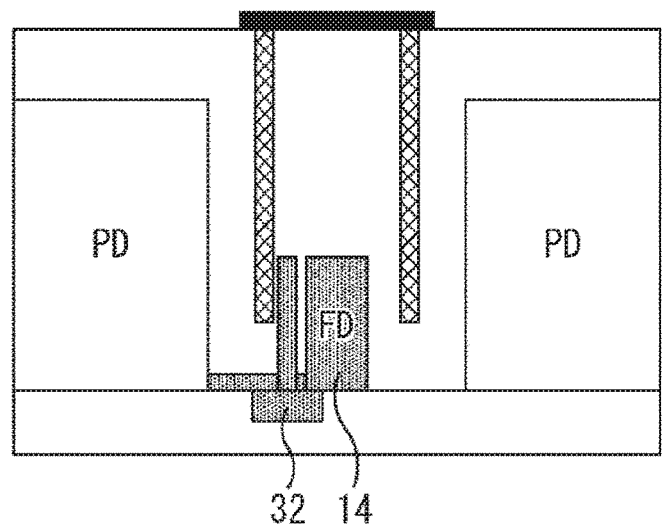
FIG. 14 is a plan view illustrating a modified example of the second configuration example of the solid-state imaging element.

FIG. 14 illustrates a modified example in which the vertical transistor 32 is added and formed inside the tubular cross portion 21, and the FD 14 is extended in a longitudinal direction inside the cross portion 21. By extending the FD 14 in the longitudinal direction, the capacity thereof can be secured or increased without increasing the area thereof in a lateral direction.

Figure 15:
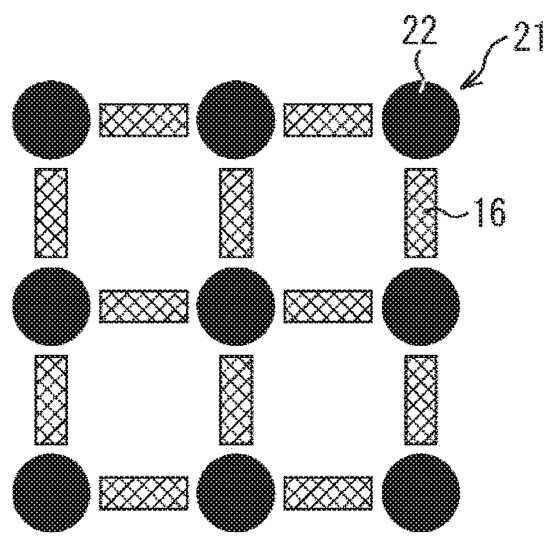
FIG. 15 is a plan view in a case where a light shielding wall and a cross portion are separately formed.

Note that in the above description, the light shielding wall 16 between pixels and the cross portion 21 where the light shielding walls 16 cross each other are formed at the same time. However, as illustrated in FIG. 15, the light shielding wall 16 and the cross portion 21 may be separately formed. In a case where the light shielding wall 16 and the cross portion 21 are separately formed, it is possible to separately set etching rates (depths) thereof.

Figure 16:
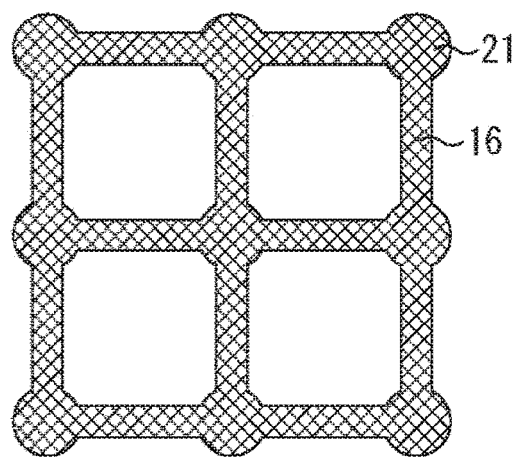
FIG. 16 is a plan view in a case where a light shielding wall and a cross portion are integrally formed.

Of course, as illustrated in FIG. 16, the light shielding wall 16 and the cross portion 21 may be integrally formed. In this case, it is necessary to set the etching rates (depths) of the light shielding wall 16 and the cross portion 21 to a common value.

Third Embodiment

Next, a third configuration example (third embodiment) of the solid-state imaging element to which the present disclosure is applied will be described with reference to FIGS. 17 to 19.

Figure 17:
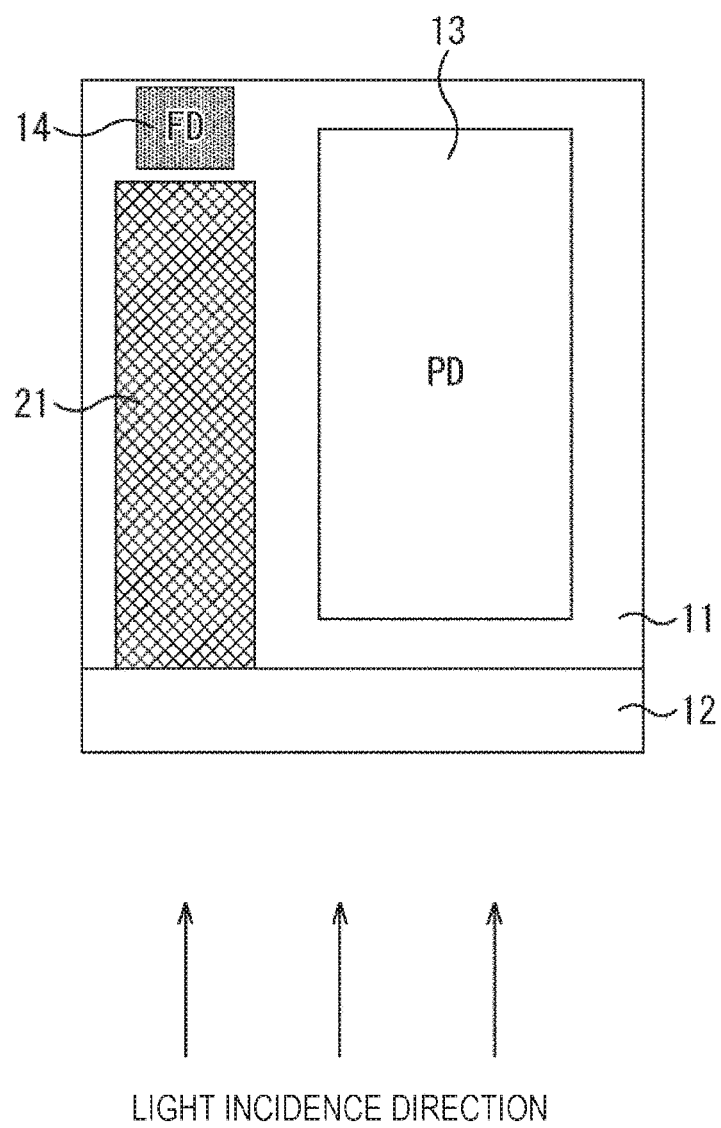
FIG. 17 is a cross-sectional view illustrating a third configuration example of the solid-state imaging element to which the present disclosure is applied.

FIG. 17 is a cross-sectional view for one pixel of the solid-state imaging element according to the third embodiment. As is apparent from FIG. 17, in the third embodiment, the light shielding cover 22 according to the first embodiment, illustrated in FIG. 3, is omitted. However, the light shielding cover 22 may be disposed.

Figure 18:
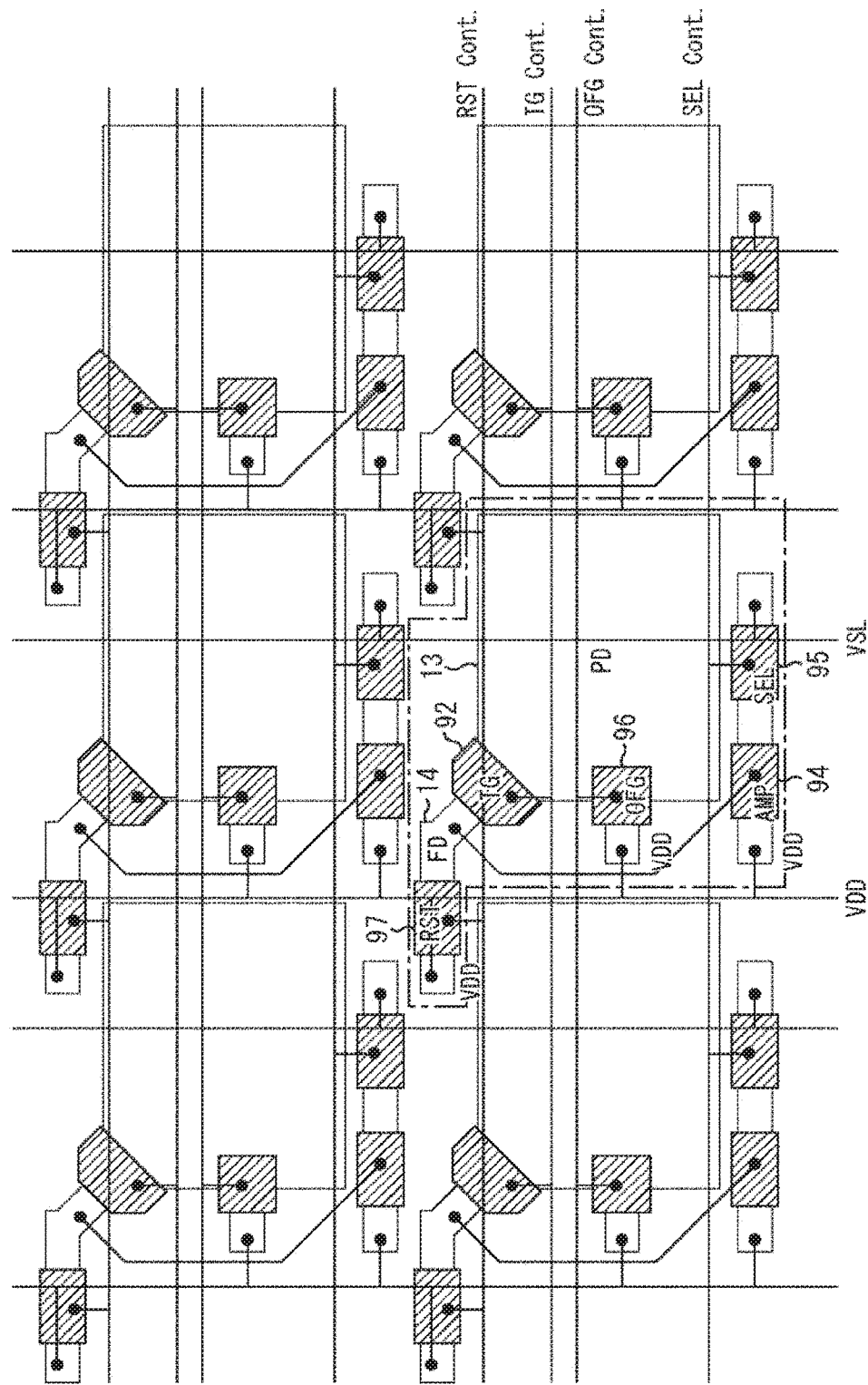
FIG. 18 is a plan view illustrating the third configuration example of the solid-state imaging element to which the present disclosure is applied.

FIG. 18 is a plan view for six pixels of the solid-state imaging element according to the third embodiment. However, in FIG. 18, illustration of a light shielding wall 16 and a cross portion 21 is omitted, and a region surrounded by a one-dot chain line is a constituent element for one pixel.

Figure 19:
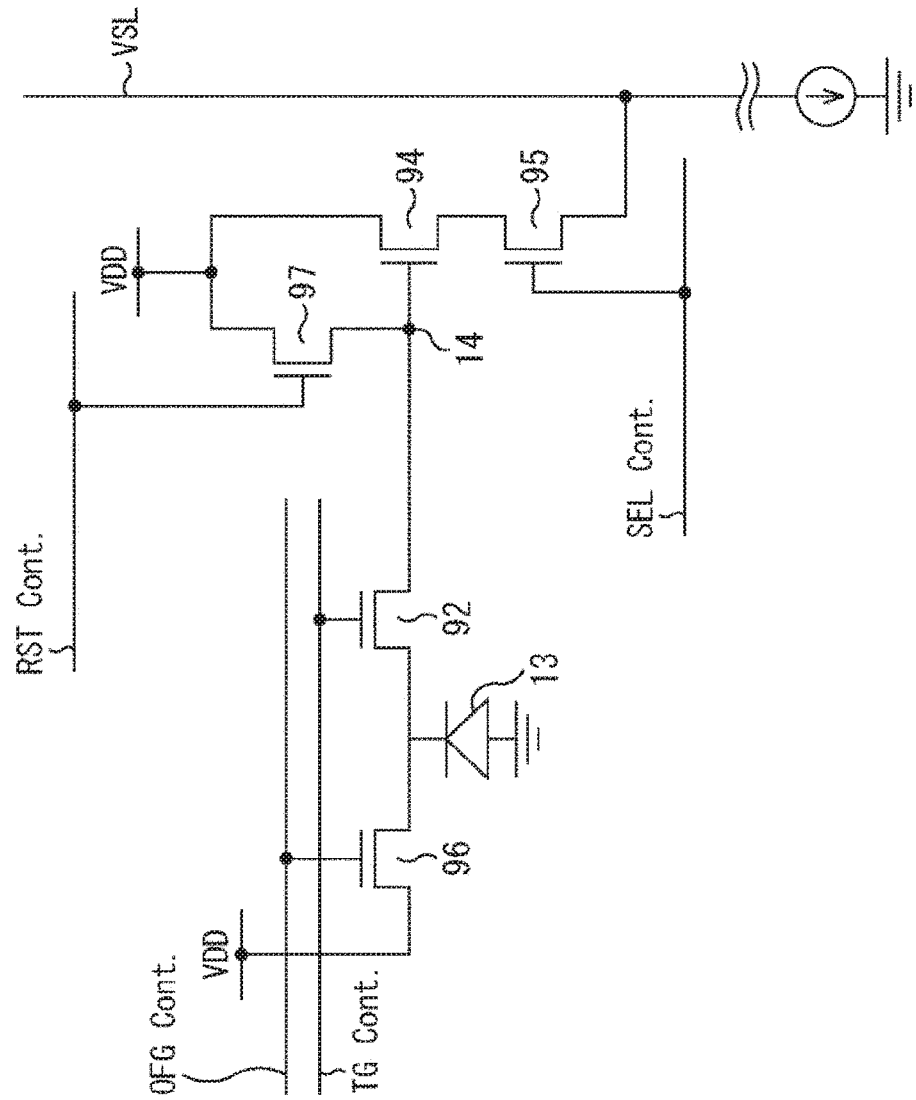
FIG. 19 is an equivalent circuit diagram of the third configuration example of the solid-state imaging element.

FIG. 19 illustrates an equivalent circuit for one pixel of the solid-state imaging element according to the third embodiment. As illustrated in FIG. 19, the solid-state imaging element according to the third embodiment has a configuration in which five transistors (MOS FETs) (TG 92, AMP 94, SEL 95, OFG 96, and RST 97) are used in addition to a PD 13 and a FD 14, and a source of the RST 97 and the FD 14 are integrally formed.

In the solid-state imaging element according to the third embodiment, by making the source of the RST 97 and the FD 14 common, false signal generation points are consolidated into one place, and the source of the RST 97 and the FD 14 are disposed below the cross portion 21. Therefore, generation of a false signal due to stray light can be suppressed.

Fourth Embodiment

Next, a fourth configuration example (fourth embodiment) of the solid-state imaging element to which the present disclosure is applied will be described with reference to FIGS. 20 and 21.

A cross section of the solid-state imaging element according to the fourth embodiment is configured similarly to that of the third embodiment illustrated in FIG. 7. Also in the fourth embodiment, the light shielding cover 22 according to the first embodiment, illustrated in FIG. 3, may be disposed or omitted.

Figure 20:
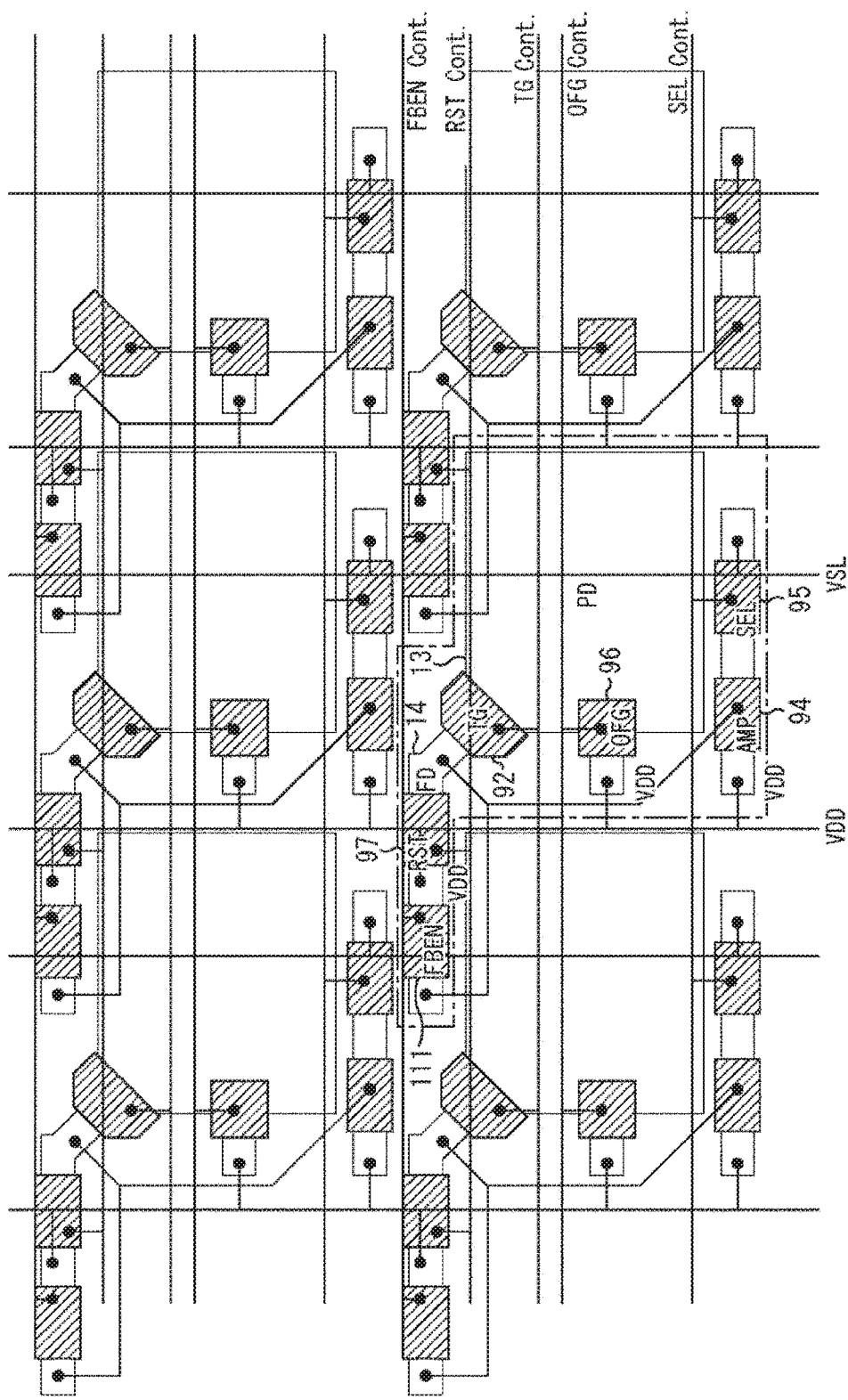
FIG. 20 is a plan view illustrating a fourth configuration example of the solid-state imaging element to which the present disclosure is applied.

FIG. 20 is a plan view for six pixels of the solid-state imaging element according to the fourth embodiment. However, in FIG. 20, illustration of a light shielding wall 16 and a cross portion 21 is omitted, and a region surrounded by a one-dot chain line is a constituent element for one pixel.

Figure 21:
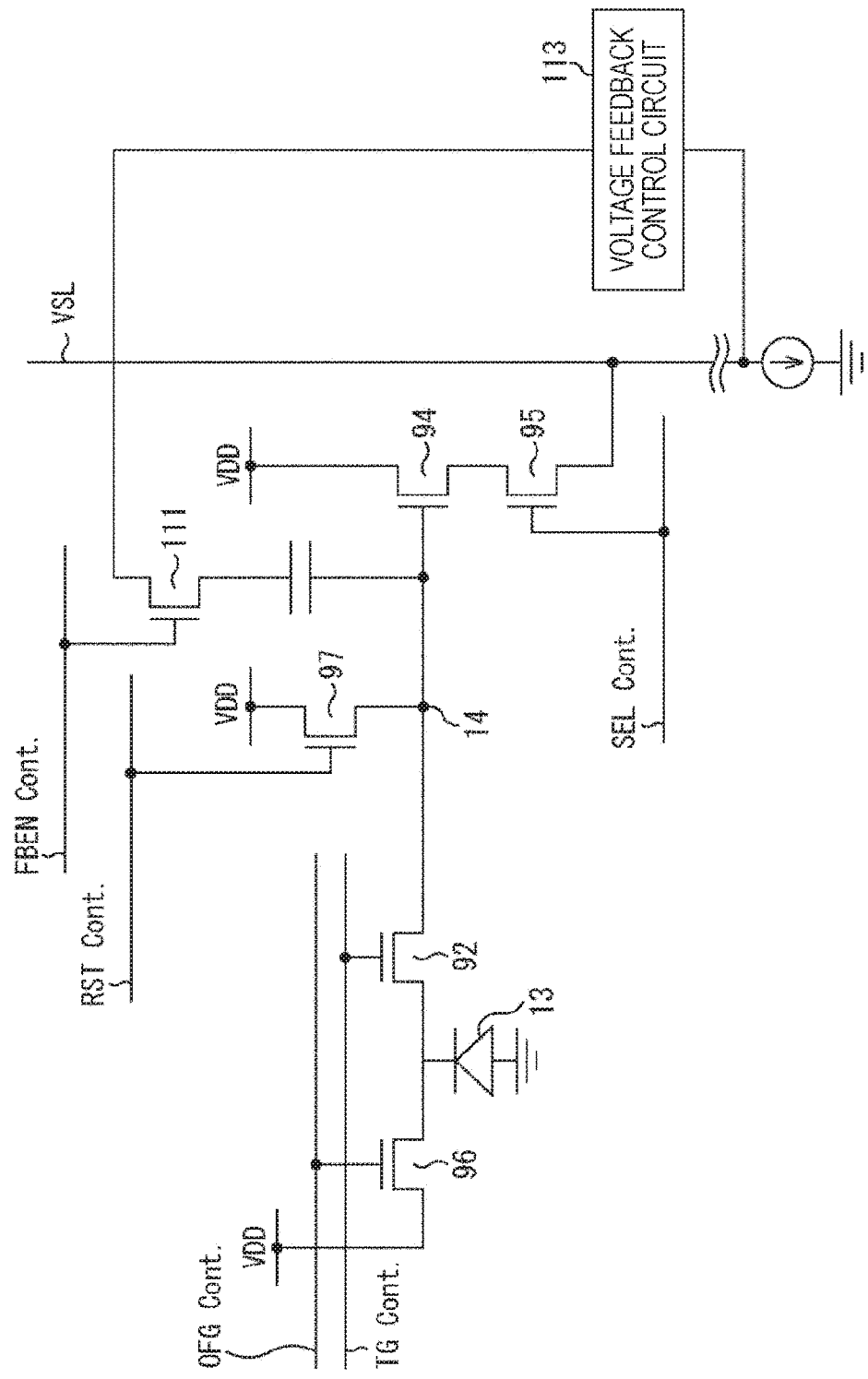
FIG. 21 is an equivalent circuit diagram of the fourth configuration example of the solid-state imaging element.

FIG. 21 illustrates an equivalent circuit for one pixel of the solid-state imaging element according to the fourth embodiment. As illustrated in FIG. 21, the fourth embodiment has a configuration in which a feedback enable (FBEN) transistor 111 and a voltage feedback control circuit 113 for controlling the FBEN transistor 111 are added to the third embodiment illustrated in FIG. 19.

That is, the solid-state imaging element according to the fourth embodiment has a configuration in which six transistors (MOS FETs) (TG 92, AMP 94, SEL 95, OFG 96, RST 97, and FBEN 111) are used in addition to a PD 13 and a FD 14 and a source of the RST 97 and the FD 14 are integrally formed.

In the solid-state imaging element according to the fourth embodiment, by making the source of the RST 97 and the FD 14 common, false signal generation points are consolidated into one place, and the source of the RST 97 and the FD 14 are disposed below the cross portion 21, and therefore generation of a false signal due to stray light can be suppressed.

In addition, in the solid-state imaging element according to the fourth embodiment, by disposing the FBEN 111 and the voltage feedback control circuit 113, kTc noise (reset noise) can be suppressed.

Fifth Embodiment

Next, a fifth configuration example (fifth embodiment) of the solid-state imaging element to which the present disclosure is applied will be described with reference to FIG. 22.

A cross section of the solid-state imaging element according to the fifth embodiment is configured similarly to that of the third embodiment illustrated in FIG. 7. Also in the fifth embodiment, the light shielding cover 22 according to the first embodiment, illustrated in FIG. 3, may be disposed or omitted.

Figure 22:
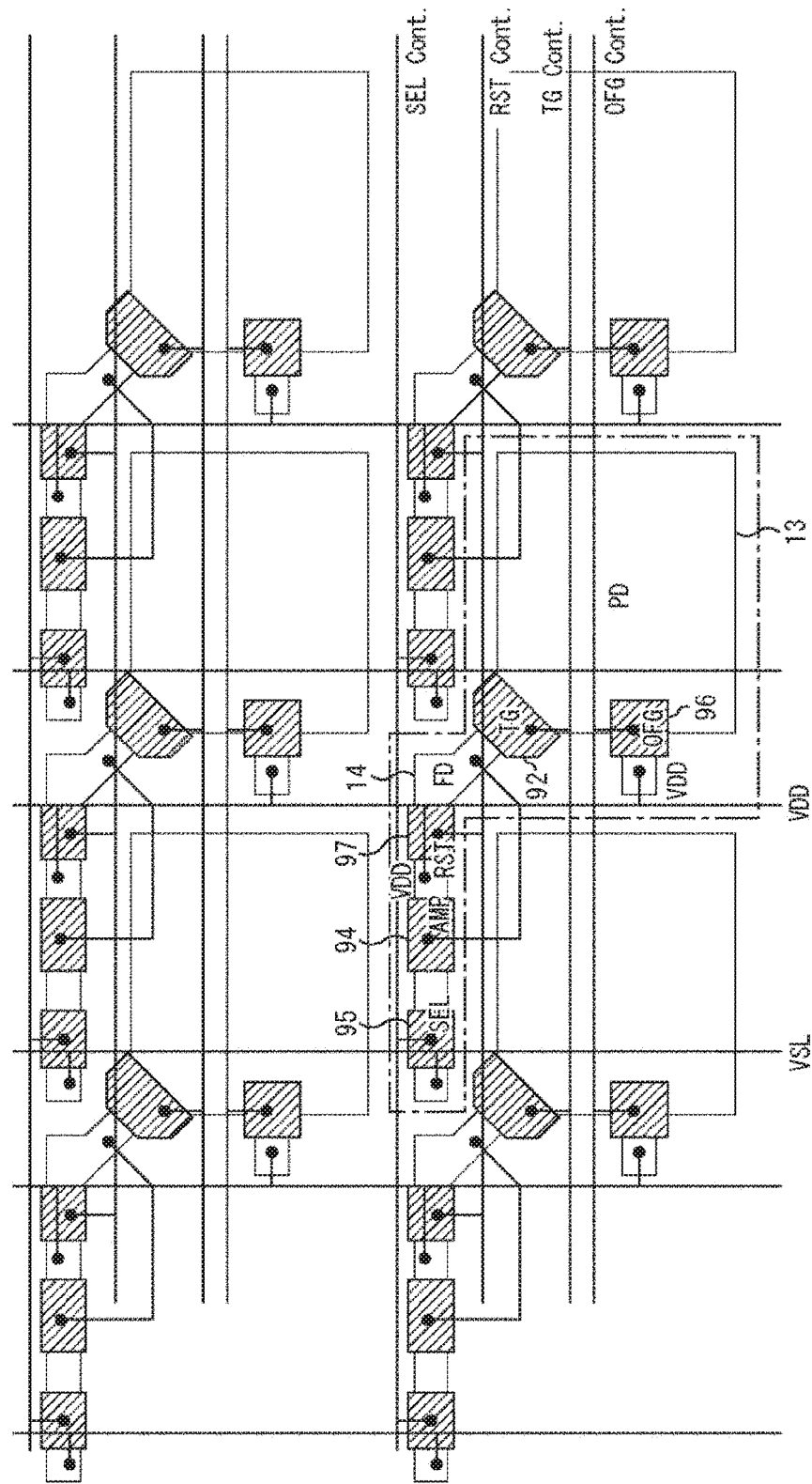
FIG. 22 is a plan view illustrating a fifth configuration example of the solid-state imaging element to which the present disclosure is applied.

FIG. 22 is a plan view for six pixels of the solid-state imaging element according to the fifth embodiment. However, in FIG. 22, illustration of a light shielding wall 16 and a cross portion 21 is omitted, and a region surrounded by a one-dot chain line is a constituent element for one pixel.

An equivalent circuit of the solid-state imaging element according to the fifth embodiment is the same as the equivalent circuit according to the third embodiment illustrated in FIG. 19, and therefore illustration thereof is omitted.

As illustrated in FIG. 22, the solid-state imaging element according to the fifth embodiment has a configuration in which five transistors (MOS FETs) (TG 92, AMP 94, SEL 95, OFG 96, and RST 97) are used in addition to a PD 13 and a FD 14 similarly to the third embodiment, and a source of the RST 97 and the FD 14 are integrally formed.

In the solid-state imaging element according to the fifth embodiment, by making the source of the RST 97 and the FD 14 common, false signal generation points are consolidated into one place, and the source of the RST 97 and the FD 14 are disposed below the cross portion 21, and therefore generation of a false signal due to stray light can be suppressed.

Furthermore, in the solid-state imaging element according to the fifth embodiment, the AMP 94 and the SEL 95 are disposed adjacent to the RST 96, and a drain of the AMP 94 and a drain of the RST 97 share a single wire and are connected to the VDD 101. Therefore, the area occupied by the PD 13 in the area per pixel can be enlarged, and the light receiving sensitivity and the saturation charge amount can be increased.

<Modified Examples of Third to Fifth Embodiments>

Next, a modified example of the solid-state imaging element according to the third embodiment, illustrated in FIG. 17, will be described with reference to FIGS. 23 to 25.

Figure 23:
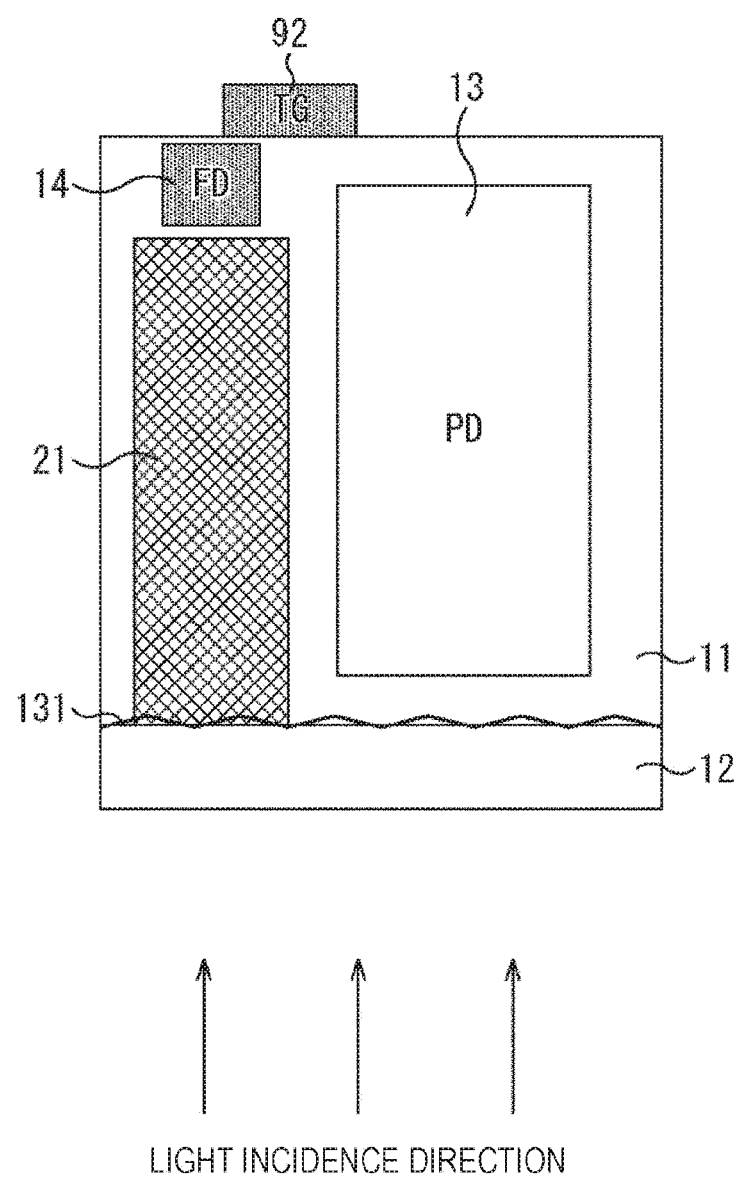
FIG. 23 is a cross-sectional view illustrating a modified example of the third configuration example of the solid-state imaging element.

FIG. 23 illustrates a modified example in which a moth eye structure unit 131 is added to a surface of the Si substrate 11.

The moth eye structure unit 131 has been subjected to fine protrusion processing, and can reflect incident light irregularly. As a result, the incident light travels straight through the PD 13 not only in a thickness direction of the Si substrate 11 but also in a lateral direction and is reflected by the light shielding wall 16 or the cross portion 21. Therefore, an optical path length up to the FD 14 can be extended. Therefore, the amount of light that can reach the FD 14 can be suppressed (stray light can be suppressed).

Figure 24:
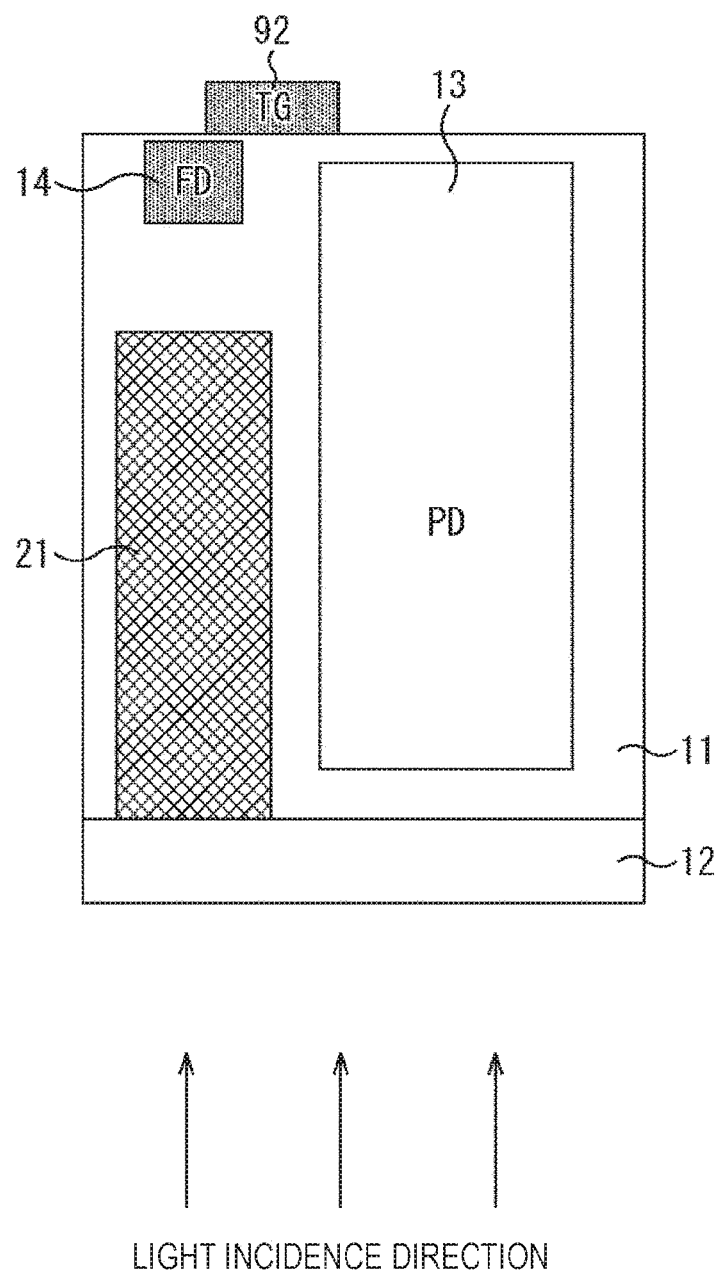
FIG. 24 is a cross-sectional view illustrating a modified example of the third configuration example of the solid-state imaging element.

FIG. 24 illustrates a modified example in which the thickness of the Si substrate 11 is increased and the length of the PD 13 in a thickness direction of the Si substrate 11 is increased accordingly.

By increasing the length of the PD 13, it is possible to increase the light receiving sensitivity and the saturation charge amount of the PD 13, and also to extend the optical path length up to the FD 14. Therefore, the amount of light that can reach the FD 14 can be suppressed (stray light can be suppressed).

FIG. 25 illustrates a modified example in which a VG electrode 141 is added between the PD 13 and the TG 92.

By disposing the VG electrode 141, the optical path length up to the FD 14 can be extended, and therefore the amount of light that can reach the FD 14 can be suppressed. In addition, the VG electrode 141 can shield stray light with respect to the FD 14.

Note that the modified examples illustrated in FIGS. 23 to 25 can be appropriately combined with one another. In addition, the modified examples can be applied not only to the third embodiment but also to other embodiments and modified examples thereof.

<Disadvantage of Light Shielding Wall 16 and Cross Portion 21>

In the first to fifth embodiments described above, by forming the FD 14 below the cross portion 21, an effect of suppressing stray light with respect to the FD 14 is achieved.

However, there is also a disadvantage of disposing the cross portion 21 and the light shielding wall 16.

For example, in a case where the volume per pixel in the Si substrate is determined, the volume of the PD 13 is reduced by forming the light shielding wall 16 and the cross portion 21, leading to a decrease in the light receiving sensitivity and a decrease in the saturation charge amount.

Hereinafter, a configuration example in which an influence of volume reduction of the PD 13 can be minimized while the light shielding wall 16 and the cross portion 21 are disposed will be described. Before the description, characteristics of the PD 13 will be described.

The absorption coefficient of light by the PD 13 depends on a wavelength, and is $8 \times 10^4$ [cm$^{-1}$] for blue light (B) with a wavelength of 400 nm, $6 \times 10^3$ [cm$^{-1}$] for green light (G) with a wavelength of 500 nm, and $2 \times 10^3$ [cm$^{-1}$] for red light (R) with a wavelength of 700 nm. That is, among the R, G, and B light, the red light having a long wavelength has the poorest absorptivity in the PD 13, and the blue light having a short wavelength has the best absorptivity in the PD 13.

In other words, the blue light is absorbed at a shallow position of the PD 13, the green light is absorbed at a middle position of the PD 13, and the red light is absorbed at a deep position of the PD 13. Therefore, it can be said that a pixel receiving light with a longer wavelength has a higher risk of stray light with respect to the FD 14.

Therefore, in the embodiments described below, in order to minimize an influence of volume reduction of the PD 13, the position, width, and depth of each of the light shielding wall 16 and the cross portion 21 are changed in accordance with the wavelength (that is, the color) of light to be received by a pixel.

Sixth Embodiment

Figure 26:
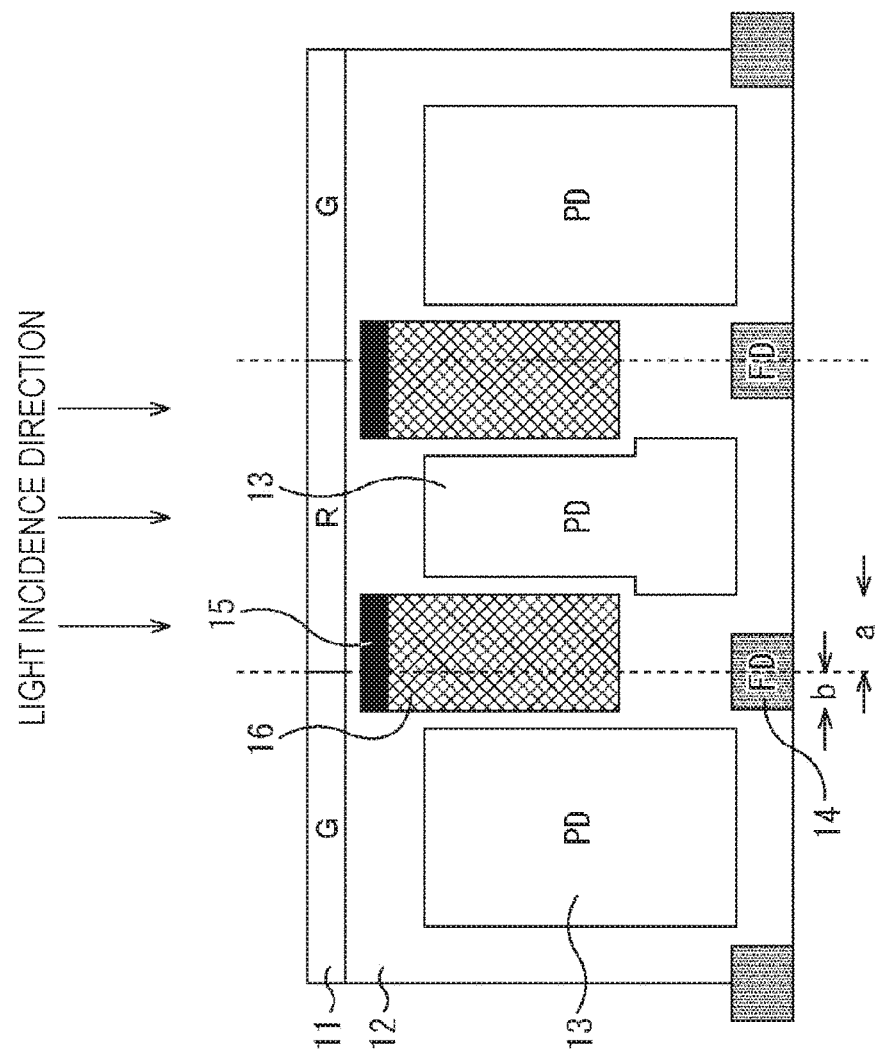
FIG. 26 is a cross-sectional view illustrating a sixth configuration example of the solid-state imaging element to which the present disclosure is applied.

Next, a sixth configuration example (sixth embodiment) of the solid-state imaging element to which the present disclosure is applied will be described with reference to FIG. 26.

In the solid-state imaging element according to the sixth embodiment, similarly to the first embodiment illustrated in FIG. 3, a light shielding cover 15 and a pillar-shaped light shielding wall 16 (including a cross portion 21) are formed between pixels, and an FD 14 is formed below the light shielding wall 16. However, as for a pixel of R (a pixel receiving red light) having the highest risk of stray light with respect to the FD 14, the position of the light shielding wall 16 is formed so as to be enlarged toward the PD 13 side, and the volume of a PD 13 is reduced by the enlargement of the light shielding wall 16.

Note that, in the case of the sixth embodiment, an insulating film material having a lower refractive index than Si is embedded in the light shielding wall 16. However, an antireflection film material may be used instead of the insulating film material.

That is, in a case where attention is paid to the pixel of R in the sixth embodiment, a distance a between an end of the light shielding wall 16 and the center of the FD 14 below the light shielding wall 16 is longer than a distance b between an end of the light shielding wall 16 and the center of the FD 14 below light shielding wall 16 in a pixel of G (pixel receiving green light) adjacent to the pixel of R. This makes it possible to suppress stray light passing through the pixel of R and reaching the FD 14. In addition, the volume of the PD 13 at a shallow position and a middle position is reduced, but the volume of the PD 13 at a deep position mainly absorbing (photoelectrically converting) red light is not reduced. Therefore, an influence of volume reduction of the PD 13 can be suppressed.

Meanwhile, in a case where attention is paid to the pixel of G, a distance between an end of the light shielding wall 16 and the center of the FD 14 below the light shielding wall 16 is shorter than that of the pixel of R. However, green light is mainly absorbed in the middle of the PD 13, and therefore it is considered that an influence of stray light passing through the pixel of G and reaching the FD 14 is small. In addition, the volume of the PD 13 can be larger in the pixel of G than that in the pixel of R.

Note that a pixel of B (pixel receiving blue light) is not illustrated but is assumed to be configured similarly to the pixel of G.

Figure 27:
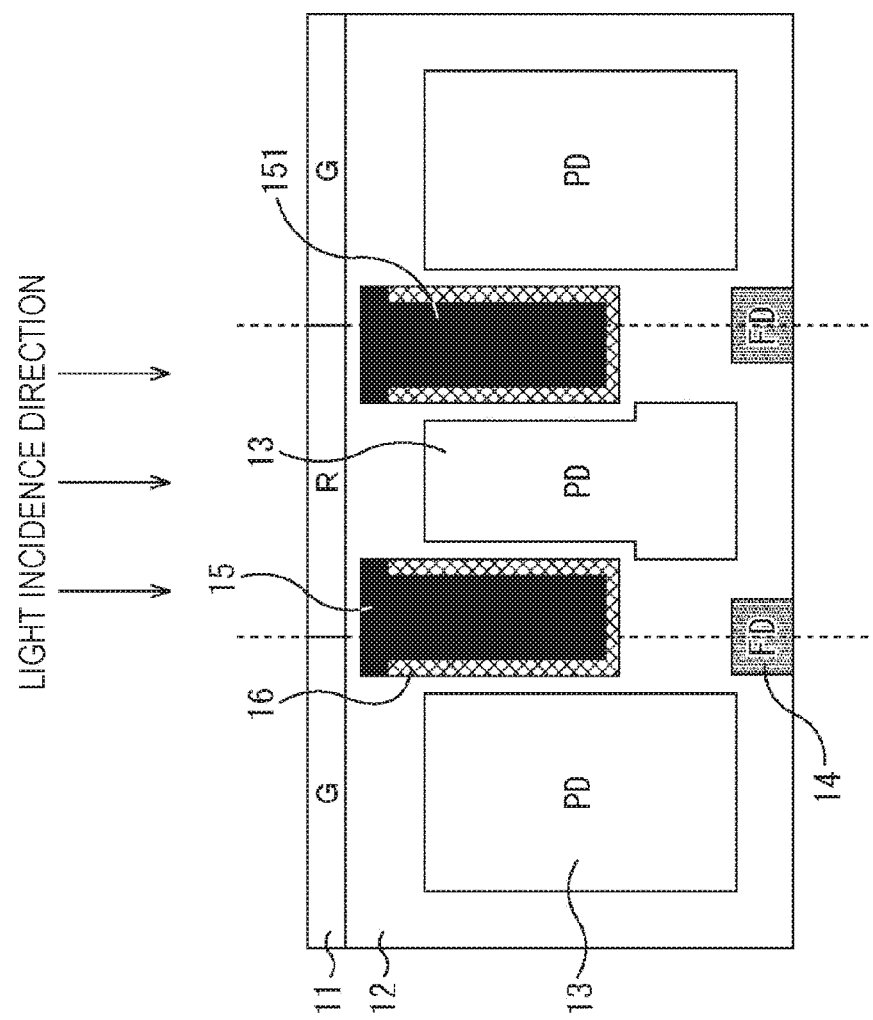
FIG. 27 is a cross-sectional view illustrating a modified example of the sixth configuration example of the solid-state imaging element.

FIG. 27 illustrates a modified example of the sixth embodiment. In this modified example, a metal material 151 is embedded in an insulating film material forming the pillar-shaped light shielding wall 16. Also in this modified example, a similar effect to that of the sixth embodiment can be obtained.

Seventh Embodiment

Figure 28:
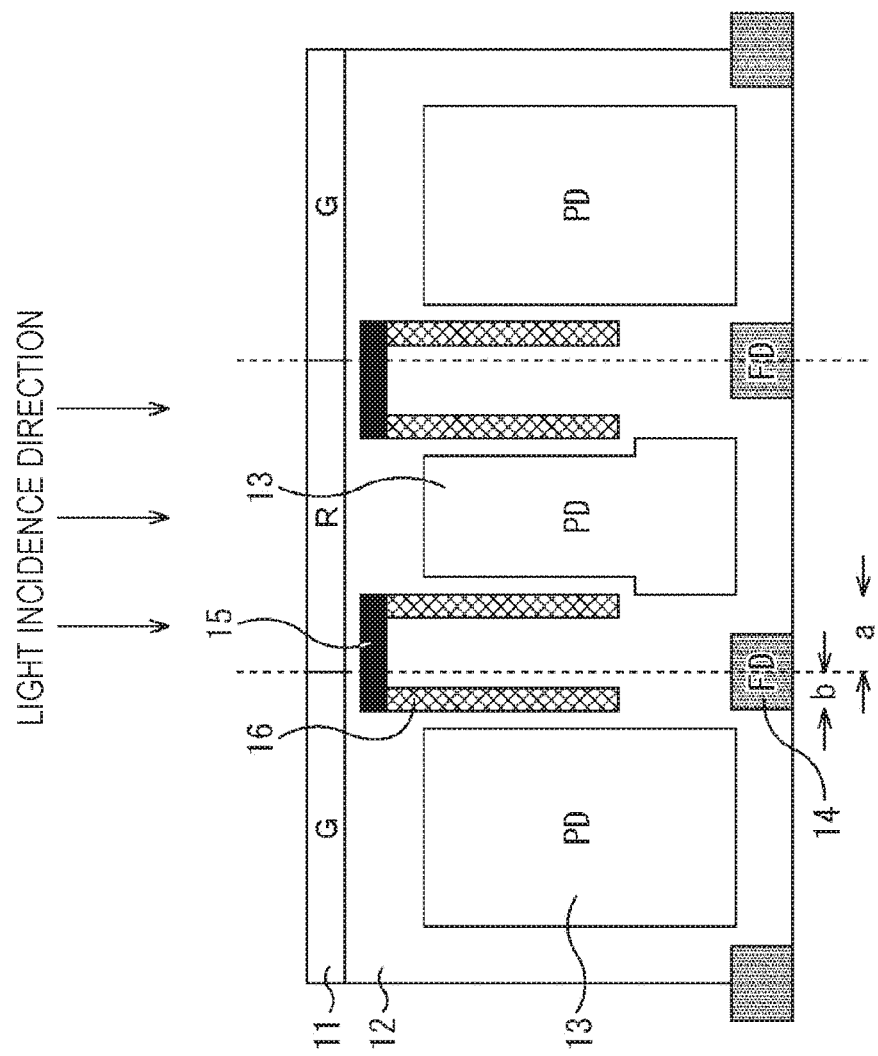
FIG. 28 is a cross-sectional view illustrating a seventh configuration example of the solid-state imaging element to which the present disclosure is applied.

Next, a seventh configuration example (seventh embodiment) of the solid-state imaging element to which the present disclosure is applied will be described with reference to FIG. 28.

In the solid-state imaging element according to the seventh embodiment, similarly to the second embodiment illustrated in FIG. 8, a light shielding cover 15 and a tubular light shielding wall 16 (including a cross portion 21) are formed between pixels, and an FD 14 is formed below the light shielding wall 16. A material of the light shielding wall 16 is similar to that of the sixth embodiment. However, as for a pixel of R having the highest risk of stray light with respect to the FD 14, the position of the light shielding wall 16 is formed so as to be enlarged toward a PD 13 side, and the volume of the PD 13 is reduced by the enlargement of the light shielding wall 16.

That is, in a case where attention is paid to the pixel of R in the seventh embodiment, a lateral distance a between an end of the light shielding wall 16 and the center of the FD 14 below the light shielding wall 16 is longer than a lateral distance b between an end of the light shielding wall 16 and the center of the FD 14 below light shielding wall 16 in a pixel of G adjacent to the pixel of R. This makes it possible to suppress stray light passing through the pixel of R and reaching the FD 14. In addition, the volume of the PD 13 at a shallow position and a middle position is reduced, but the volume of the PD 13 at a deep position mainly absorbing (photoelectrically converting) red light is not reduced. Therefore, an influence of volume reduction of the PD 13 can be suppressed.

Meanwhile, in a case where attention is paid to the pixel of G, a distance between an end of the light shielding wall 16 and the center of the FD 14 below the light shielding wall 16 is shorter than that of the pixel of R. However, green light is mainly absorbed in the middle of the PD 13, and therefore it is considered that an influence of stray light passing through the pixel of G and reaching the FD 14 is small. In addition, the volume of the PD 13 can be larger in the pixel of G than that in the pixel of R.

Note that a pixel of B is not illustrated but is assumed to be configured similarly to the pixel of G.

As a modified example of the seventh embodiment, a metal material may be embedded in the tubular light shielding wall 16. Also in this modified example, a similar effect to that of the seventh embodiment can be obtained.

Eighth Embodiment

Figure 29:
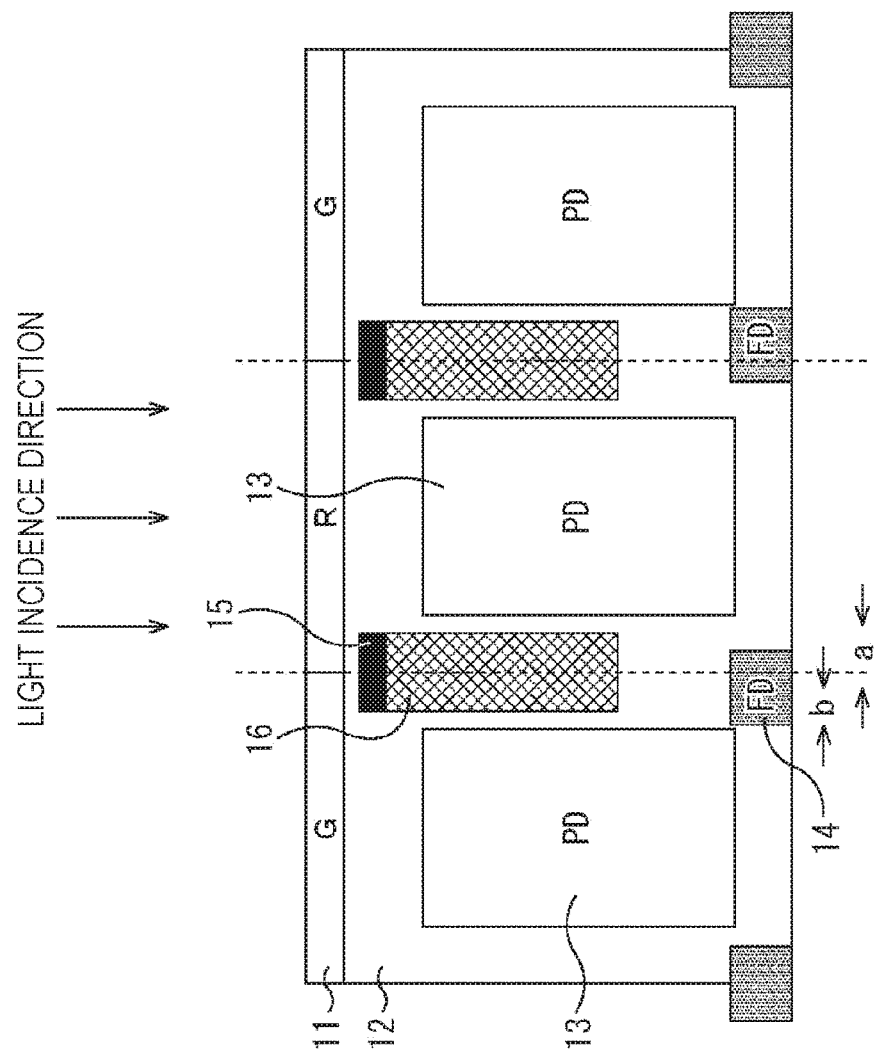
FIG. 29 is a cross-sectional view illustrating an eighth configuration example of the solid-state imaging element to which the present disclosure is applied.

Next, an eighth configuration example (eighth embodiment) of the solid-state imaging element to which the present disclosure is applied will be described with reference to FIG. 29.

In the solid-state imaging element according to the eighth embodiment, each of a PD 13, a light shielding cover 15, and a light shielding wall 16 (including a cross portion 21) is formed in a common shape among pixels of the colors, and an FD 14 is formed below the light shielding wall 16. A material of the light shielding wall 16 is similar to that of the sixth embodiment.

However, the FD 14 concerning a region of a pixel of R having the highest risk of stray light with respect to the FD 14 is formed at a position close to the side of a pixel of G adjacent to the pixel of R.

That is, in a case where attention is paid to the pixel of R in the eighth embodiment, a lateral distance a between an end of the light shielding wall 16 and the center of the FD 14 below the light shielding wall 16 is longer than a lateral distance b between an end of the light shielding wall 16 and the center of the FD 14 below light shielding wall 16 in a pixel of G adjacent to the pixel of R. This makes it possible to suppress stray light passing through the pixel of R and reaching the FD 14. Meanwhile, in a case where attention is paid to the pixel of G, a distance between an end of the light shielding wall 16 and the center of the FD 14 below the light shielding wall 16 is shorter than that of the pixel of R. However, green light is mainly absorbed in the middle of the PD 13, and therefore it is considered that an influence of stray light passing through the pixel of G and reaching the FD 14 is small.

Note that a pixel of B is not illustrated but is assumed to be configured similarly to the pixel of G.

As a modified example of the eighth embodiment, a metal material may be embedded in the pillar-shaped light shielding wall 16. Also in this modified example, a similar effect to that of the seventh embodiment can be obtained.

Ninth Embodiment

Figure 30:
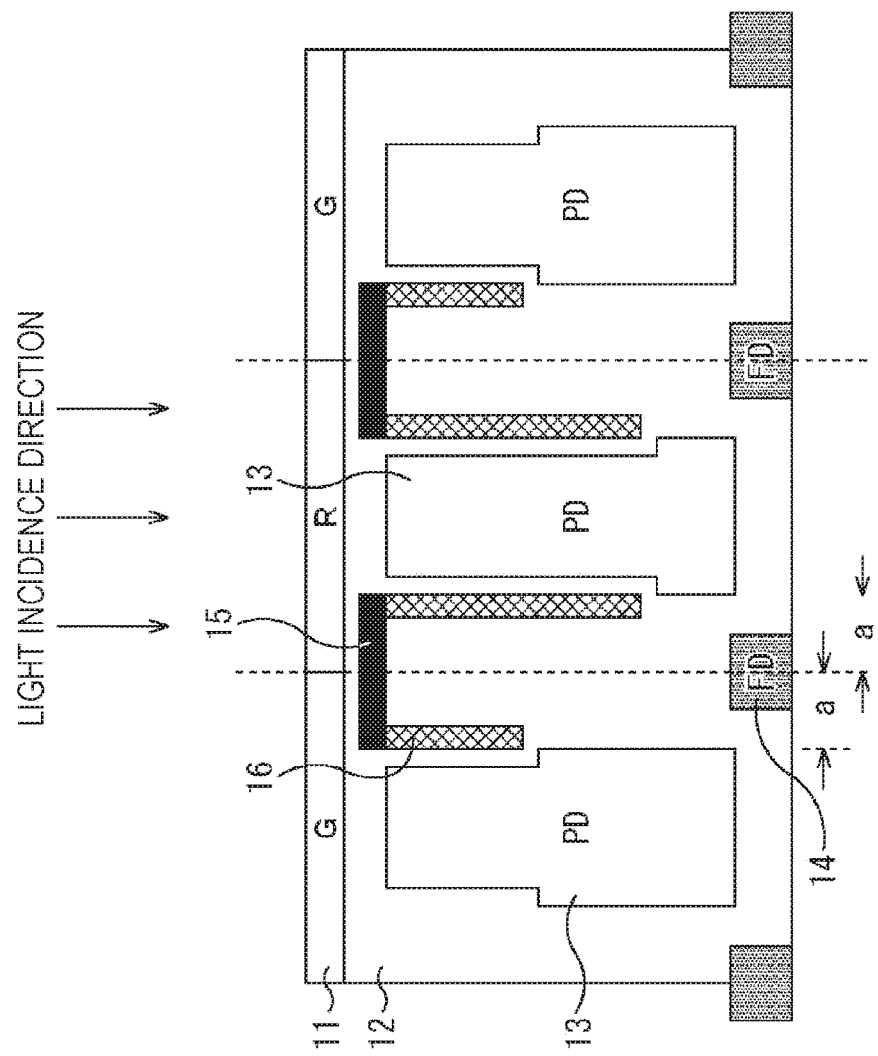
FIG. 30 is a cross-sectional view illustrating a ninth configuration example of the solid-state imaging element to which the present disclosure is applied.

Next, a ninth configuration example (ninth embodiment) of the solid-state imaging element to which the present disclosure is applied will be described with reference to FIG. 30.

In the solid-state imaging element according to the ninth embodiment, similarly to the second embodiment illustrated in FIG. 8, a light shielding cover 15 and a tubular light shielding wall 16 (including a cross portion 21) are formed between pixels, and an FD 14 is formed below the light shielding wall 16. A material of the light shielding wall 16 is similar to that of the sixth embodiment. However, the depth of the light shielding wall 16 is different between the R pixel side where a risk of stray light with respect to an FD 14 is the highest and the G pixel side, and the light shielding wall 16 is formed more deeply on the R pixel side than that on the G pixel side. In addition, the shape of a PD 13 is different according to a difference in the depth of the light shielding wall 16 between the pixel of R and the pixel of G, and the shape of the PD 13 is reduced up to the depth where the light shielding wall 13 exists.

That is, in the pixel of R and the pixel of G in the ninth embodiment, the lateral distance a between an end of the light shielding wall 16 and the center of the FD 14 below the light shielding wall 16 is common, but the depth of the light shielding wall 16 is deeper in the pixel of R. Therefore, a similar effect to those of the above-described sixth to eighth embodiments can be achieved.

<Use Example of Solid-State Imaging Element>

The above-described first to ninth embodiments and modified examples thereof can be appropriately combined with one another.

Figure 31:
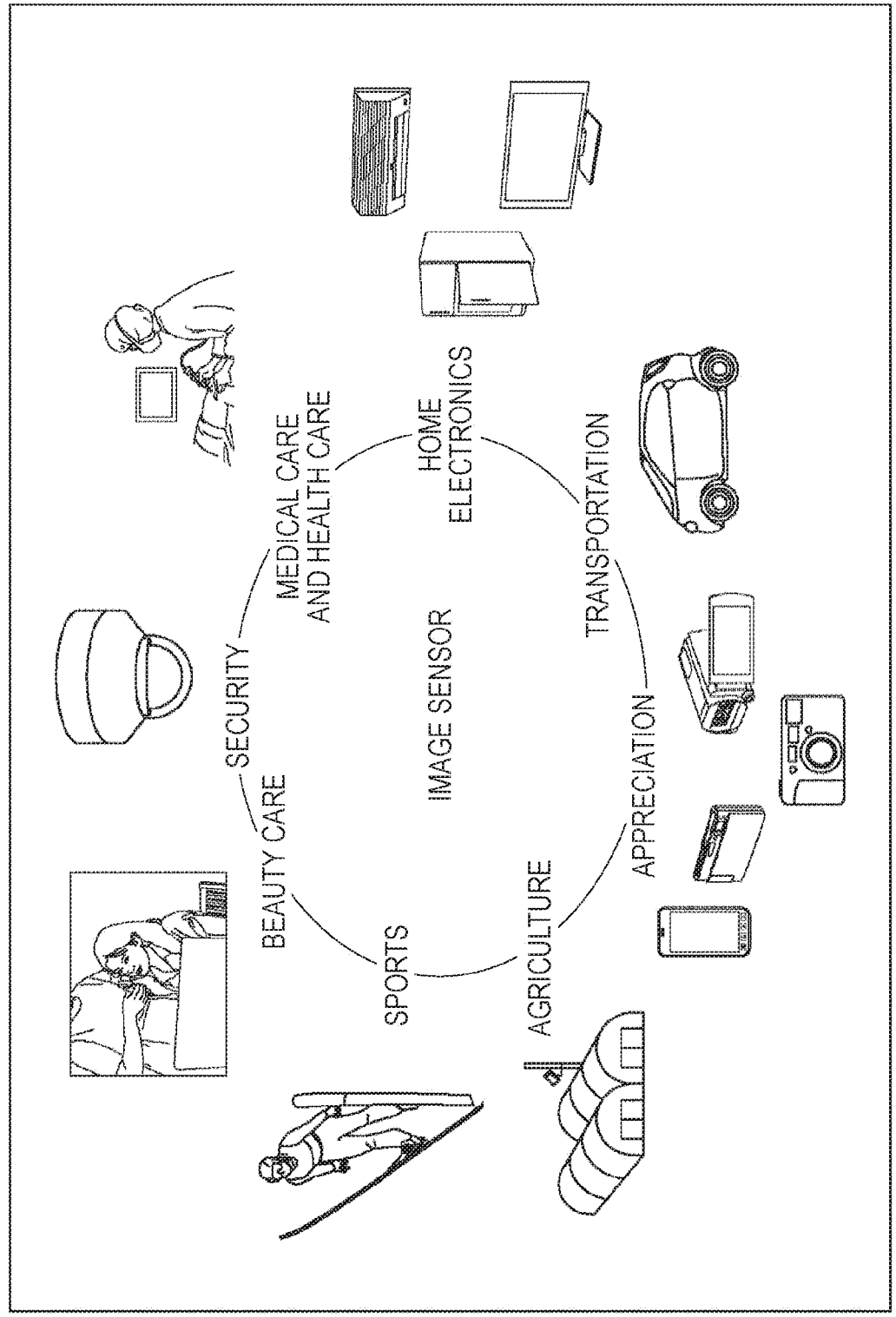
FIG. 31 is a diagram illustrating a use example of a solid-state imaging element.

FIG. 31 is a diagram illustrating a use example in which the solid-state imaging element according to any one of the above-described first to ninth embodiments is used.

As described below, for example, the above-described imaging element can be used in various cases of sensing light such as visible light, infrared light, ultraviolet light, or an X-ray.

- An apparatus for imaging an image used for appreciation, such as a digital camera or a portable device with a camera function
- An apparatus used for transportation, such as a vehicle-mounted sensor for imaging the front, the back, the surrounding, the inside, or the like of an automobile for safe driving such as automatic stop, for recognition of a driver's condition, and the like, a surveillance camera for monitoring a running vehicle and a road, or a measuring sensor for measuring a distance between vehicles or the like
- An apparatus used for home electronics, such as a television set, a refrigerator, or an air conditioner for imaging a gesture of a user and operating a device according to the gesture
- An apparatus used for medical care and health care, such as an endoscope or an apparatus for receiving infrared light for angiography
- An apparatus used for security, such as a surveillance camera for crime prevention or a camera for personal authentication
- An apparatus used for beauty care, such as a skin measurement device for imaging a skin or a microscope for imaging a scalp
- An apparatus used for sports, such as an action camera or a wearable camera for sports and the like
- An apparatus used for agriculture, such as a camera for monitoring a condition of a field and a crop <Application Example to In-Vivo Information Acquiring System>

The technology according to the present disclosure (the present technology) can be applied to various products.

Figure 32:
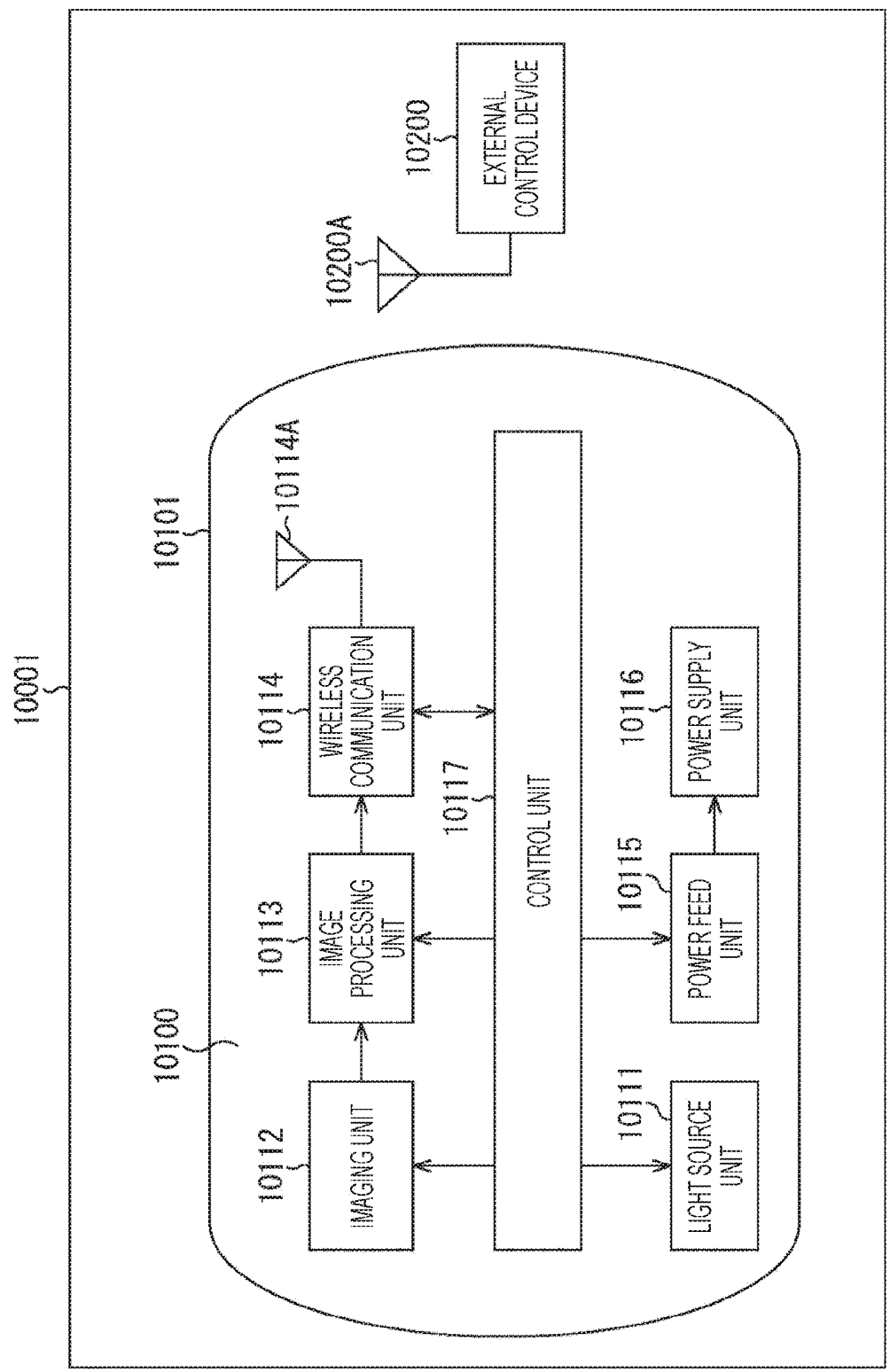
FIG. 32 is a block diagram illustrating an example of a schematic configuration of an in-vivo information acquiring system.

FIG. 32 is a block diagram illustrating an example of a schematic configuration of a patient in-vivo information acquiring system using a capsule type endoscope to which the technology according to the present disclosure (the present technology) can be applied.

An in-vivo information acquiring system 10001 includes a capsule type endoscope 10100 and an external control device 10200.

The capsule type endoscope 10100 is swallowed by a patient at the time of examination. The capsule type endoscope 10100 has an imaging function and a wireless communication function. While moving inside an organ such as the stomach or the intestine by peristaltic movement or the like before natural discharge from a patient, the capsule type endoscope 10100 sequentially images an image of an inside of the organ (hereinafter also referred to as an in-vivo image) at predetermined intervals, and sequentially wirelessly transmits information regarding the in-vivo image to the external control device 10200 outside the body.

The external control device 10200 integrally controls an operation of the in-vivo information acquiring system 10001. In addition, the external control device 10200 receives information regarding the in-vivo image transmitted from the capsule type endoscope 10100, and generates image data for displaying the in-vivo image on a display device (not illustrated) on the basis of the received information regarding the in-vivo image.

In this way, the in-vivo information acquiring system 10001 can obtain an in-vivo image obtained by imaging the state of an inside of a patient body at any time during a period between swallow of the capsule type endoscope 10100 and discharge thereof.

The configurations and functions of the capsule type endoscope 10100 and the external control device 10200 will be described in more detail.

The capsule type endoscope 10100 includes a capsule type casing 10101, and the casing 10101 houses a light source unit 10111, an imaging unit 10112, an image processing unit 10113, a wireless communication unit 10114, a power feed unit 10115, a power supply unit 10116, and a control unit 10117.

The light source unit 10111 includes a light source such as a light emitting diode (LED), and irradiates an imaging field of view of the imaging unit 10112 with light, for example.

The imaging unit 10112 includes an imaging element and an optical system including a plurality of lenses disposed in a preceding stage of the imaging element. Reflected light (hereinafter referred to as observation light) of light with which a body tissue as an observation target has been irradiated is collected by the optical system and is incident on the imaging element. In the imaging unit 10112, the imaging element photoelectrically converts observation light incident thereon, and an image signal corresponding to the observation light is generated. The image signal generated by the imaging unit 10112 is provided to the image processing unit 10113.

The image processing unit 10113 includes a processor such as a central processing unit (CPU) or a graphics processing unit (GPU), and performs various signal processing on the image signal generated by the imaging unit 10112. The image processing unit 10113 provides the image signal subjected to the signal processing as RAW data to the wireless communication unit 10114.

The wireless communication unit 10114 performs predetermined processing such as modulation processing on the image signal subjected to signal processing by the image processing unit 10113 and transmits the image signal to the external control device 10200 via an antenna 10114A. In addition, the wireless communication unit 10114 receives a control signal concerning driving control of the capsule type endoscope 10100 from the external control device 10200 via the antenna 10114A. The wireless communication unit 10114 provides the control signal received from the external control device 10200 to the control unit 10117.

The power feed unit 10115 includes an antenna coil for power reception, a power regeneration circuit for regenerating power from a current generated in the antenna coil, a booster circuit, and the like. The power feed unit 10115 generates power using the principle of so-called non-contact charging.

The power supply unit 10116 includes a secondary battery, and stores power generated by the power feed unit 10115. In FIG. 32, in order to avoid complication of the drawing, illustration of an arrow or the like indicating the destination of power supply from the power supply unit 10116 is omitted. However, the power stored in the power supply unit 10116 is supplied to the light source unit 10111, the imaging unit 10112, the image processing unit 10113, the wireless communication unit 10114, and the control unit 10117, and can be used for driving of these units.

The control unit 10117 includes a processor such as a CPU, and appropriately controls driving of the light source unit 10111, the imaging unit 10112, the image processing unit 10113, the wireless communication unit 10114, and the power feed unit 10115 according to a control signal transmitted from the external control device 10200.

The external control device 10200 includes a processor such as a CPU or a GPU, or a microcomputer, a control board, or the like on which a processor and a storage element such as a memory are mixedly mounted. The external control device 10200 controls an operation of the capsule type endoscope 10100 by transmitting a control signal to the control unit 10117 of the capsule type endoscope 10100 via an antenna 10200A. In the capsule type endoscope 10100, for example, light irradiation conditions with respect to an observation target in the light source unit 10111 can be changed by a control signal from the external control device 10200. In addition, imaging conditions (for example, a frame rate in the imaging unit 10112, an exposure value, or the like) can be changed by the control signal from the external control device 10200. In addition, depending on the control signal from the external control device 10200, the contents of the processing in the image processing unit 10113 and conditions under which the wireless communication unit 10114 transmits an image signal (for example, a transmission interval, the number of transmitted images, or the like) may be changed.

In addition, the external control device 10200 performs various image processing on an image signal transmitted from the capsule type endoscope 10100, and generates image data for displaying the imaged in-vivo image on a display device. As the image processing, for example, various signal processing such as development processing (demosaic processing), high image quality processing (band enhancement processing, super-resolution processing, noise reduction (NR) processing, and/or camera shake correction processing, for example), and/or enlargement processing (electronic zoom processing) can be performed. The external control device 10200 controls driving of the display device and causes the display device to display an in-vivo image imaged on the basis of the generated image data. Alternatively, the external control device 10200 may cause a recording device (not illustrated) to record the generated image data, or cause a printing device (not illustrated) to print out the generated image data.

An example of the in-vivo information acquiring system to which the technology according to the present disclosure can be applied has been described above.

Figure 33:
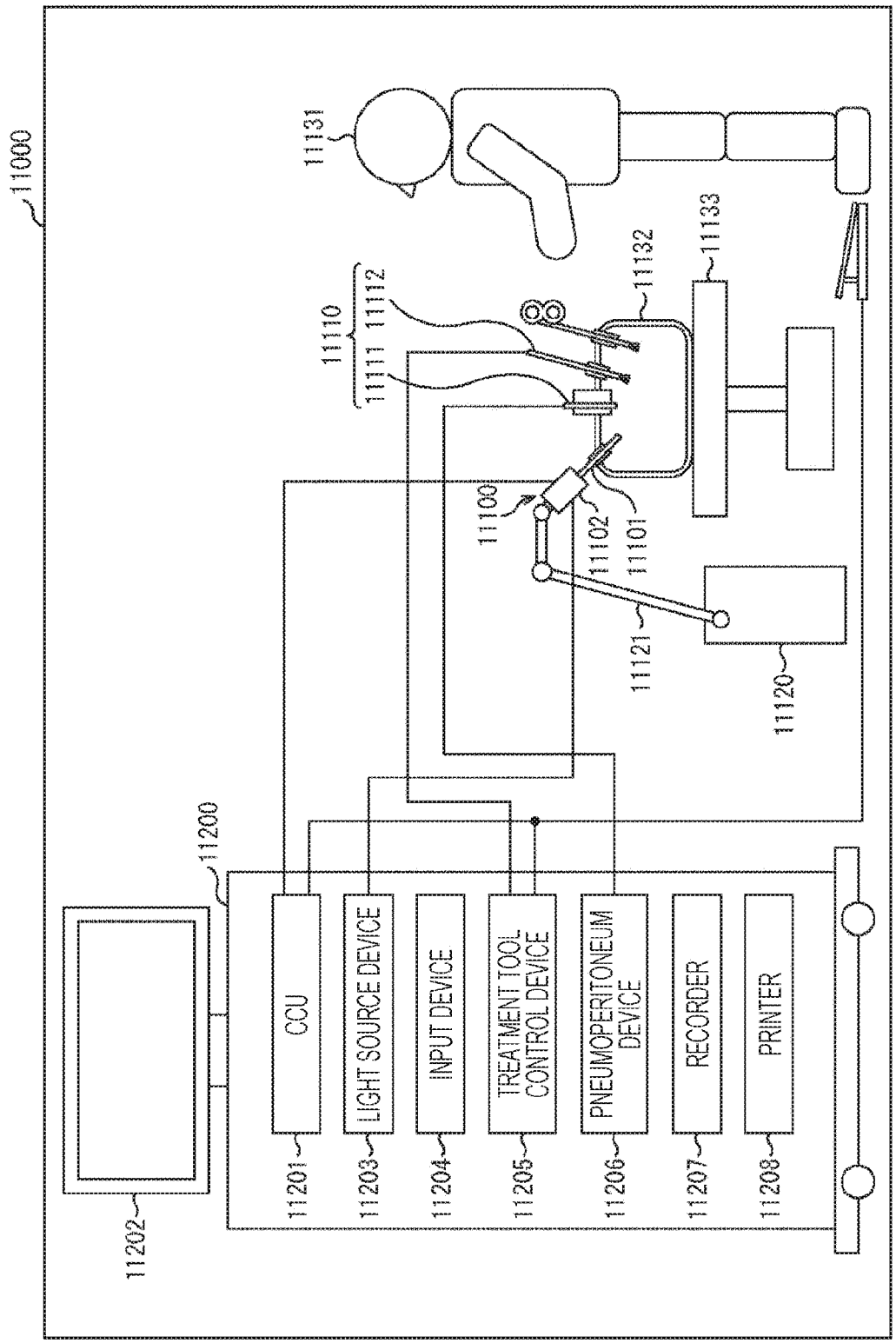
FIG. 33 is a diagram illustrating an example of a schematic configuration of an endoscopic surgical system.

FIG. 33 is a diagram illustrating an example of a schematic configuration of an endoscopic surgical system to which the technology according to the present disclosure (the present technology) can be applied.

FIG. 33 illustrates a situation in which a surgeon (physician) 11131 is performing surgery on a patient 11132 on a patient bed 11133 using an endoscopic surgical system 11000. As illustrated in the drawing, the endoscopic surgical system 11000 includes an endoscope 11100, another surgical tool 11110 such as a pneumoperitoneum tube 11111 or an energy treatment tool 11112, a support arm device 11120 for supporting the endoscope 11100, and a cart 11200 on which various devices for endoscopic surgery are mounted.

The endoscope 11100 includes a lens barrel 11101 to be inserted into a body cavity of the patient 11132 in a region of a predetermined length from a tip thereof, and a camera head 11102 connected to a proximal end of the lens barrel 11101. In the illustrated example, the endoscope 11100 configured as a so-called rigid mirror including the rigid lens barrel 11101 is illustrated, but the endoscope 11100 may be configured as a so-called flexible mirror including a flexible lens barrel.

At the tip of the lens barrel 11101, an opening into which an objective lens is fitted is disposed. A light source device 11203 is connected to the endoscope 11100. Light generated by the light source device 11203 is guided to the tip of the lens barrel by a light guide extended inside the lens barrel 11101, and is emitted toward an observation target in a body cavity of the patient 11132 via the objective lens. Note that the endoscope 11100 may be a direct view mirror, a perspective view mirror, or a side view mirror.

An optical system and an imaging element are disposed inside the camera head 11102. Reflected light (observation light) from an observation target is converged on the imaging element by the optical system. The observation light is photoelectrically converted by the imaging element, and an electric signal corresponding to the observation light, that is, an image signal corresponding to an observation image is generated. The image signal is transmitted as RAW data to a camera control unit (CCU) 11201.

The CCU 11201 includes a central processing unit (CPU), a graphics processing unit (GPU), and the like, and integrally controls operations of the endoscope 11100 and the display device 11202. Furthermore, the CCU 11201 receives an image signal from the camera head 11102, and performs, on the image signal, various image processing for displaying an image based on the image signal, such as development processing (demosaic processing), for example.

The display device 11202 displays an image based on an image signal subjected to image processing by the CCU 11201 under the control of the CCU 11201.

The light source device 11203 includes a light source such as a light emitting diode (LED), for example, and supplies irradiation light for imaging a surgical site or the like to the endoscope 11100.

An input device 11204 is an input interface to the endoscopic surgical system 11000. A user can input various kinds of information and instructions to the endoscopic surgical system 11000 via the input device 11204. For example, the user inputs an instruction or the like to change imaging conditions (type of irradiation light, magnification, focal length, and the like) by the endoscope 11100.

A treatment tool control device 11205 controls driving of the energy treatment tool 11112 for cauterizing and cutting a tissue, sealing a blood vessel, or the like. A pneumoperitoneum device 11206 feeds a gas into a body cavity via the pneumoperitoneum tube 11111 in order to inflate the body cavity of the patient 11132 for the purpose of securing a field of view by the endoscope 11100 and securing a working space of a surgeon. A recorder 11207 is a device capable of recording various kinds of information regarding surgery. A printer 11208 is a device capable of printing various kinds of information regarding surgery in various formats such as a text, an image, and a graph.

Note that the light source device 11203 for supplying irradiation light used for imaging a surgical site to the endoscope 11100 may include an LED, a laser light source, or a white light source constituted by a combination thereof, for example. In a case where the white light source is constituted by a combination of RGB laser light sources, the output intensity and the output timing of each color (each wavelength) can be controlled with high precision, and therefore adjustment of a white balance of an imaged image can be performed by the light source device 11203. In addition, in this case, by irradiating an observation target with laser light from each of the RGB laser light sources in a time division manner and controlling driving of an imaging element of the camera head 11102 in synchronization with the irradiation timing, it is also possible to image an image corresponding to each of RGB in a time division manner. According to this method, a color image can be obtained without disposing a color filter in the imaging element.

In addition, driving of the light source device 11203 may be controlled so as to change the intensity of light output at predetermined time intervals. By controlling driving of the imaging element of the camera head 11102 in synchronization with the timing of the change of the intensity of the light to acquire an image in a time division manner and synthesizing the image, a high dynamic range image without so-called blocked up shadows or blown out highlights can be generated.

In addition, the light source device 11203 may be configured so as to be able to supply light in a predetermined wavelength band corresponding to special light observation. In the special light observation, for example, by irradiation with light in a narrower band than irradiation light (that is, white light) at the time of ordinary observation using wavelength dependency of light absorption in a body tissue, a predetermined tissue such as a blood vessel of a mucosal surface layer is imaged at a high contrast, that is, so-called narrow band imaging is performed. Alternatively, in the special light observation, fluorescence observation for obtaining an image by fluorescence generated by irradiation with excitation light may be performed. In the fluorescence observation, it is possible to observe fluorescence from a body tissue (autofluorescence observation) by irradiating the body tissue with excitation light, or to obtain a fluorescent image by injecting a reagent such as indocyanine green (ICG) into a body tissue and irradiating the body tissue with excitation light corresponding to a fluorescence wavelength of the reagent, for example. The light source device 11203 can be configured so as to be able to supply narrow band light and/or excitation light corresponding to such special light observation.

Figure 34:
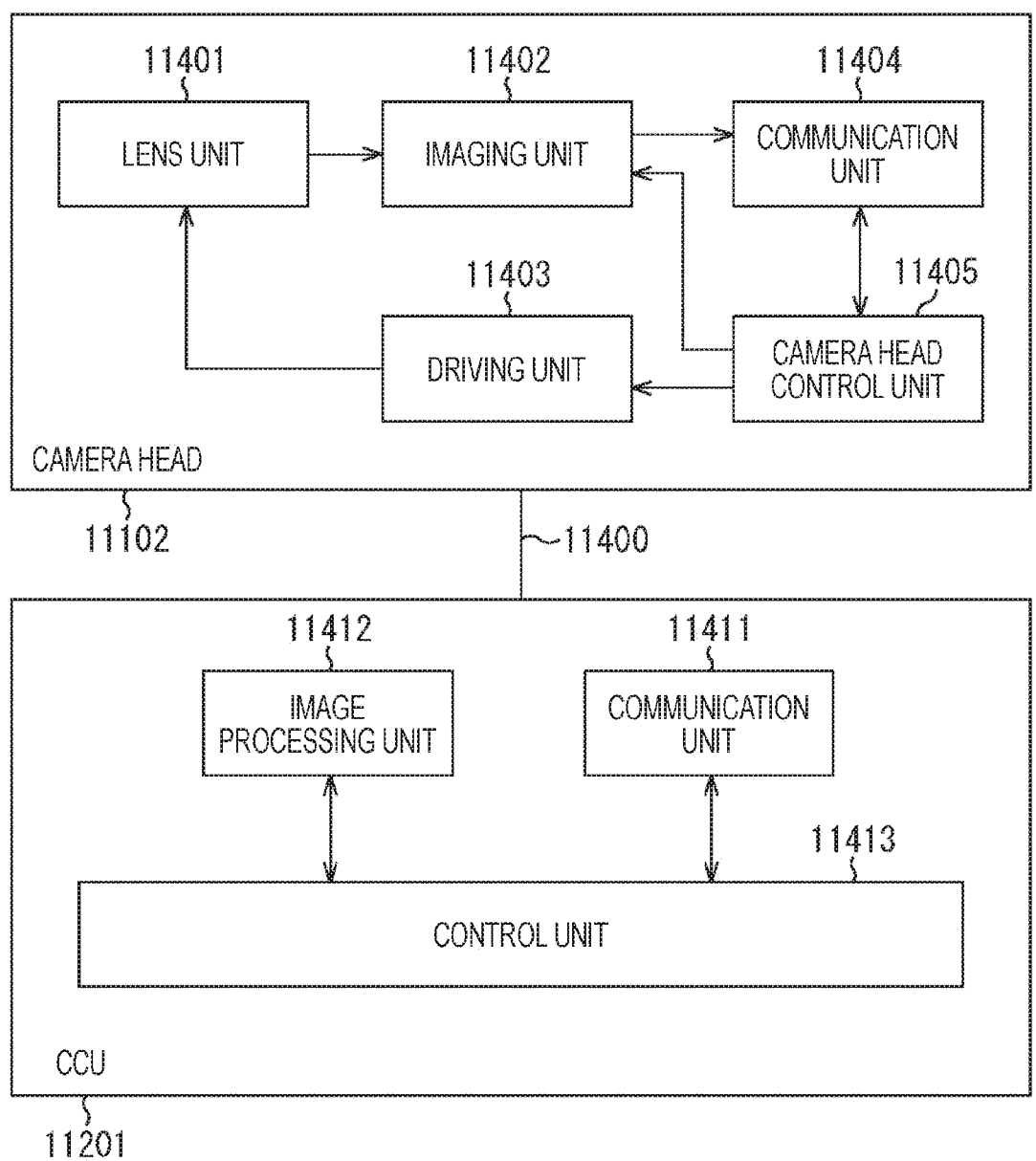
FIG. 34 is a block diagram illustrating examples of functional configurations of a camera head and a CCU.

FIG. 34 is a block diagram illustrating examples of functional configurations of the camera head 11102 and the CCU 11201 illustrated in FIG. 33.

The camera head 11102 includes a lens unit 11401, an imaging unit 11402, a driving unit 11403, a communication unit 11404, and a camera head control unit 11405. The CCU 11201 includes a communication unit 11411, an image processing unit 11412, and a control unit 11413. The camera head 11102 and the CCU 11201 are communicably connected to each other by a transmission cable 11400.

The lens unit 11401 is an optical system disposed at a connecting portion with the lens barrel 11101. Observation light taken in from a tip of the lens barrel 11101 is guided to the camera head 11102 and is incident on the lens unit 11401. The lens unit 11401 includes a combination of a plurality of lenses including a zoom lens and a focus lens.

The imaging unit 11402 includes an imaging element. The imaging unit 11402 may include one imaging element (so-called single plate type) or a plurality of imaging elements (so-called multiplate type). In a case where the imaging unit 11402 includes multiplate type imaging elements, for example, an image signal corresponding to each of RGB may be generated by each imaging element, and a color image may be obtained by synthesizing these image signals. Alternatively, the imaging unit 11402 may include a pair of imaging elements for acquiring an image signal for each of the right eye and the left eye corresponding to three-dimensional (3D) display. By performing the 3D display, the surgeon 11131 can grasp the depth of a living tissue in a surgical site more accurately. Incidentally, in a case where the imaging unit 11402 includes multiplate type imaging elements, a plurality of lens units 11401 can be disposed corresponding to the respective imaging elements.

In addition, the imaging unit 11402 is not necessarily disposed in the camera head 11102. For example, the imaging unit 11402 may be disposed just behind an objective lens inside the lens barrel 11101.

The driving unit 11403 includes an actuator, and moves a zoom lens and a focus lens of the lens unit 11401 by a predetermined distance along an optical axis under control of the camera head control unit 11405. As a result, the magnification and the focus of an image imaged by the imaging unit 11402 can be appropriately adjusted.

The communication unit 11404 includes a communication device for transmitting and receiving various kinds of information to and from the CCU 11201. The communication unit 11404 transmits an image signal obtained from the imaging unit 11402 as RAW data to the CCU 11201 via the transmission cable 11400.

In addition, the communication unit 11404 receives a control signal for controlling driving of the camera head 11102 from the CCU 11201, and supplies the control signal to the camera head control unit 11405. The control signal includes information regarding imaging conditions such as information indicating designation of a frame rate of an imaged image, information indicating designation of an exposure value at the time of imaging, and/or information indicating designation of the magnification and the focus of an imaged image, for example.

Note that the imaging conditions such as the frame rate, the exposure value, the magnification, and the focus may be appropriately designated by a user, or may be automatically set by the control unit 11413 of the CCU 11201 on the basis of an acquired image signal. In the latter case, the endoscope 11100 has a so-called auto exposure (AE) function, a so-called auto focus (AF) function, and a so-called auto white balance (AWB) function.

The camera head control unit 11405 controls driving of the camera head 11102 on the basis of a control signal from the CCU 11201 received via the communication unit 11404.

The communication unit 11411 includes a communication device for transmitting and receiving various kinds of information to and from the camera head 11102. The communication unit 11411 receives an image signal transmitted from the camera head 11102 via the transmission cable 11400.

In addition, the communication unit 11411 transmits a control signal for controlling driving of the camera head 11102 to the camera head 11102. The image signal and the control signal can be transmitted by electric communication, optical communication, or the like.

The image processing unit 11412 performs various kinds of image processing on the image signal which is RAW data transmitted from the camera head 11102.

The control unit 11413 performs various kinds of control concerning imaging of a surgical site or the like by the endoscope 11100 and display of an imaged image obtained by imaging a surgical site or the like. For example, the control unit 11413 generates a control signal for controlling driving of the camera head 11102.

In addition, the control unit 11413 causes the display device 11202 to display an imaged image of a surgical site or the like on the basis of an image signal subjected to image processing by the image processing unit 11412. In this case, the control unit 11413 may recognize various objects in the imaged image using various image recognition techniques. For example, by detecting the shape, color, and the like of an edge of an object included in the imaged image, the control unit 11413 can recognize a surgical tool such as forceps, a specific living body part, bleeding, a mist at the time of using the energy treatment tool 11112, and the like. When the display device 11202 displays the imaged image, the control unit 11413 may cause the display device 11202 to superimpose and display various kinds of surgical support information on the image of the surgical site using the recognition result. The surgical support information is superimposed and displayed, and presented to the surgeon 11131. This makes it possible to reduce a burden on the surgeon 11131 and makes it possible for the surgeon 11131 to reliably perform surgery.

The transmission cable 11400 connecting the camera head 11102 to the CCU 11201 is an electric signal cable corresponding to communication of an electric signal, an optical fiber corresponding to optical communication, or a composite cable thereof.

Here, in the illustrated example, communication is performed by wire using the transmission cable 11400, but communication between the camera head 11102 and the CCU 11201 may be performed wirelessly.

An example of the endoscopic surgical system to which the technology according to the present disclosure can be applied has been described above.

Note that the endoscopic surgical system has been described as an example here. However, the technology according to the present disclosure may also be applied to, for example, a microscopic surgery system or the like.

<Application Example to Mobile Body>

For example, the technology according to the present disclosure (the present technology) may be realized as a device mounted on any type of mobile body such as an automobile, an electric vehicle, a hybrid electric vehicle, a motorcycle, a bicycle, a personal mobility, an airplane, a drone, a ship, or a robot.

Figure 35:
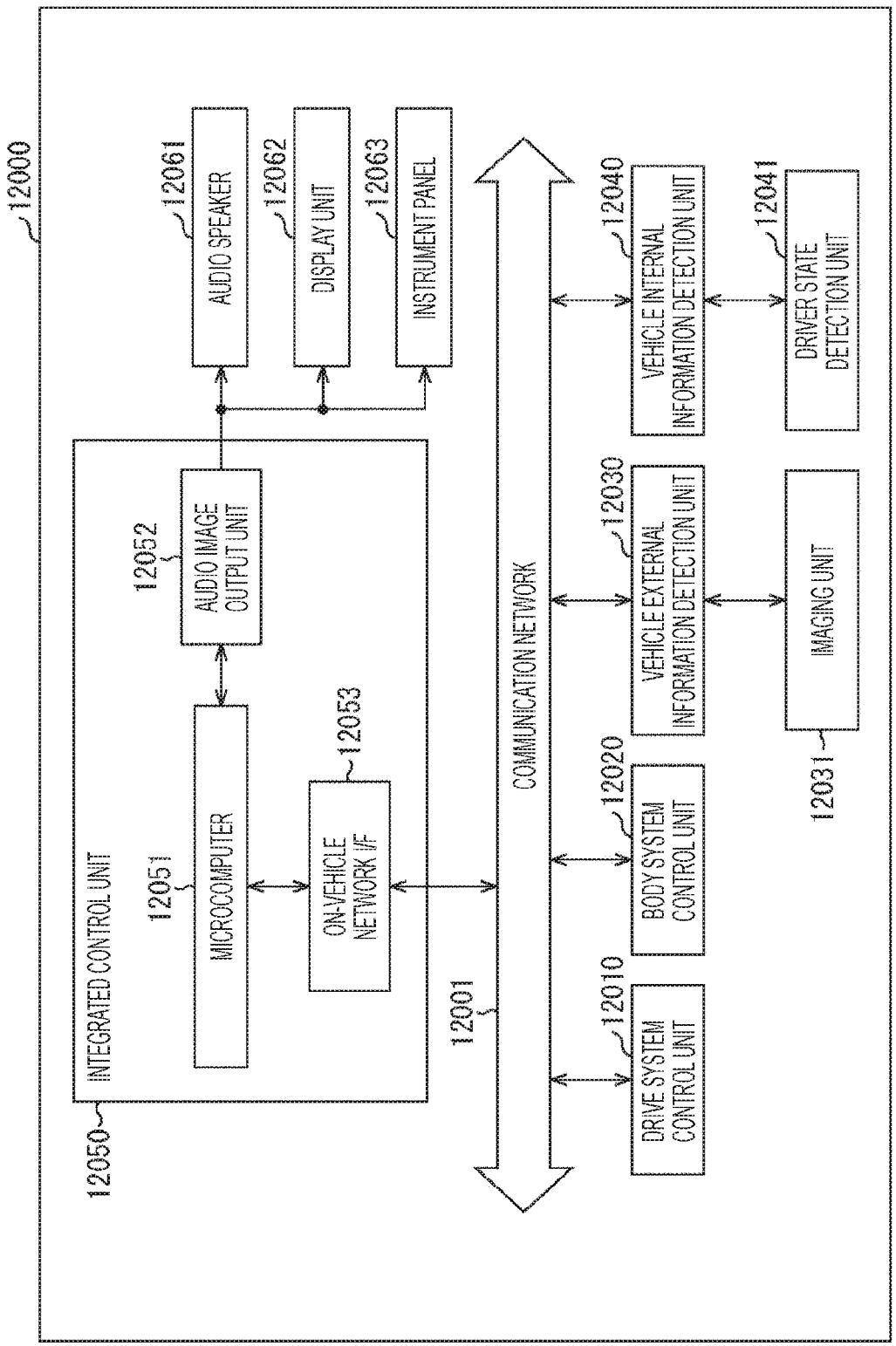
FIG. 35 is a block diagram illustrating an example of a schematic configuration of a vehicle control system.

FIG. 35 is a block diagram illustrating an example of a schematic configuration of a vehicle control system which is an example of a mobile body control system to which the technology according to the present disclosure can be applied.

A vehicle control system 12000 includes a plurality of electronic control units connected to one another via a communication network 12001. In the example illustrated in FIG. 35, the vehicle control system 12000 includes a drive system control unit 12010, a body system control unit 12020, a vehicle external information detection unit 12030, a vehicle internal information detection unit 12040, and an integrated control unit 12050. In addition, as a functional configuration of the integrated control unit 12050, a microcomputer 12051, an audio image output unit 12052, and an on-vehicle network interface (I/F) 12053 are illustrated.

The drive system control unit 12010 controls an operation of a device related to a drive system of a vehicle according to various programs. For example, the drive system control unit 12010 functions as a control device of a driving force generating device for generating a driving force of a vehicle such as an internal combustion engine or a driving motor, a driving force transmitting mechanism for transmitting a driving force to wheels, a steering mechanism for adjusting a rudder angle of a vehicle, a braking device for generating a braking force of a vehicle, and the like.

The body system control unit 12020 controls operations of various devices mounted on a vehicle body according to various programs. For example, the body system control unit 12020 functions as a control device of a keyless entry system, a smart key system, a power window device, or various lamps such as a head lamp, a back lamp, a brake lamp, a turn indicator, and a fog lamp. In this case, to the body system control unit 12020, a radio wave transmitted from a portable device substituted for a key or signals of various switches can be input. The body system control unit 12020 receives input of the radio wave or signals and controls a door lock device, a power window device, a lamp, and the like of a vehicle.

The vehicle external information detection unit 12030 detects information outside a vehicle on which the vehicle control system 12000 is mounted. For example, to the vehicle external information detection unit 12030, an imaging unit 12031 is connected. The vehicle external information detection unit 12030 causes the imaging unit 12031 to image an image outside a vehicle and receives an imaged image. The vehicle external information detection unit 12030 may perform object detection processing or distance detection processing of a person, a car, an obstacle, a sign, a character on a road surface, or the like on the basis of the received image.

The imaging unit 12031 is a light sensor for receiving light and outputting an electric signal corresponding to the amount of light received. The imaging unit 12031 can output an electric signal as an image or output the electric signal as distance measurement information. In addition, the light received by the imaging unit 12031 may be visible light or invisible light such as infrared light.

The vehicle internal information detection unit 12040 detects information inside a vehicle. To the vehicle internal information detection unit 12040, for example, a driver state detection unit 12041 for detecting the state of a driver is connected. The driver state detection unit 12041 includes, for example, a camera for imaging a driver. The vehicle internal information detection unit 12040 may calculate the degree of fatigue or the degree of concentration of a driver or may determine whether the driver is dozing off on the basis of detection information input from the driver state detection unit 12041.

The microcomputer 12051 can calculate a control target value of a driving force generating device, a steering mechanism, or a braking device on the basis of information inside and outside a vehicle, acquired by the vehicle external information detection unit 12030 or the vehicle internal information detection unit 12040, and can output a control command to the drive system control unit 12010. For example, the microcomputer 12051 can perform cooperative control aiming at realizing a function of advanced driver assistance system (ADAS) including collision avoidance or impact mitigation of a vehicle, following travel based on inter-vehicle distance, vehicle speed maintenance travel, vehicle collision warning, vehicle lane departure warning, and the like.

In addition, the microcomputer 12051 can perform cooperative control aiming at, for example, automatic driving that autonomously travels without depending on driver's operation by controlling a driving force generating device, a steering mechanism, a braking device, or the like on the basis of information around a vehicle, acquired by the vehicle external information detection unit 12030 or the vehicle internal information detection unit 12040.

In addition, the microcomputer 12051 can output a control command to the body system control unit 12020 on the basis of vehicle external information acquired by the vehicle external information detection unit 12030. For example, the microcomputer 12051 can perform cooperative control aiming at antiglare such as switching from high beam to low beam by controlling a headlamp according to the position of a preceding vehicle or an oncoming vehicle detected by the vehicle external information detection unit 12030.

The audio image output unit 12052 transmits an audio output signal and/or an image output signal to an output device capable of visually or audibly notifying a passenger of a vehicle or the outside of the vehicle of information. In the example of FIG. 35, as the output device, an audio speaker 12061, a display unit 12062, and an instrument panel 12063 are illustrated. The display unit 12062 may include an on-board display and/or a head-up display, for example.

Figure 36:
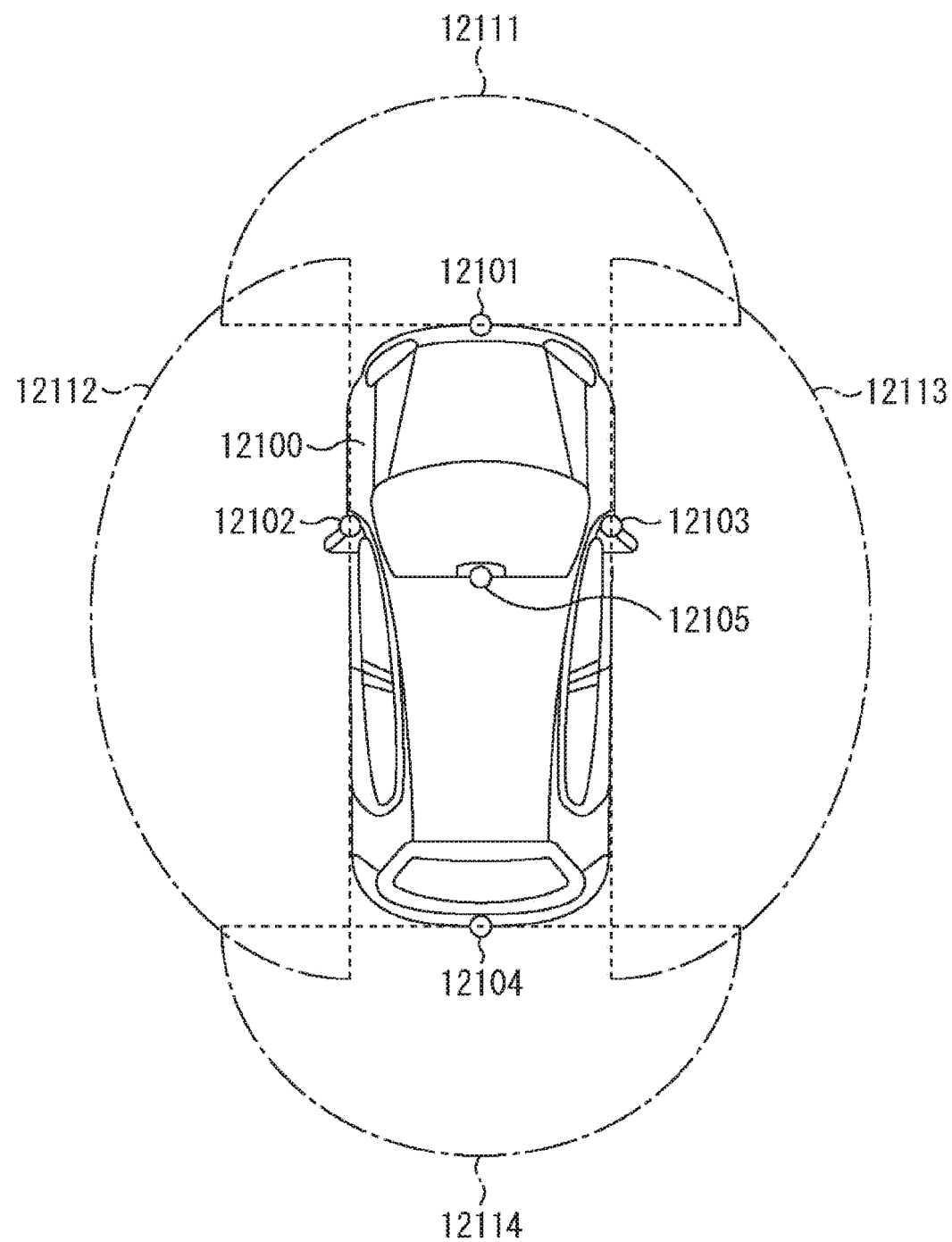
FIG. 36 is an explanatory diagram illustrating examples of installation positions of a vehicle external information detection unit and an imaging unit.

FIG. 36 is a diagram illustrating an example of an installation position of the imaging unit 12031.

In FIG. 36, the vehicle 12100 includes imaging units 12101, 12102, 12103, 12104, and 12105 as the imaging unit 12031.

The imaging units 12101, 12102, 12103, 12104, and 12105 are disposed, for example, in a front nose, a side mirror, a rear bumper, and a back door of the vehicle 12100, in an upper portion of a front glass in a passenger compartment, and the like. The imaging unit 12101 disposed in a front nose and the imaging unit 12105 disposed in an upper portion of a front glass in a passenger compartment mainly acquire images in front of the vehicle 12100. The imaging units 12102 and 12103 disposed in side mirrors mainly acquire images on sides of the vehicle 12100. The imaging unit 12104 disposed in a rear bumper or a back door mainly acquires an image behind the vehicle 12100. The front images acquired by the imaging units 12101 and 12105 are mainly used for detecting a preceding vehicle, a pedestrian, an obstacle, a traffic signal, a traffic sign, a lane, or the like.

Note that FIG. 36 illustrates examples of imaging ranges of the imaging units 12101 to 12104. An imaging range 12111 indicates an imaging range of the imaging unit 12101 disposed in a front nose. Imaging ranges 12112 and 12113 indicate imaging ranges of the imaging units 12102 and 12103 disposed in side mirrors, respectively. An imaging range 12114 indicates an imaging range of the imaging unit 12104 disposed in a rear bumper or a back door. For example, by superimposing image data imaged by the imaging units 12101 to 12104 on one another, an overhead view image of the vehicle 12100 viewed from above is obtained.

At least one of the imaging units 12101 to 12104 may have a function of acquiring distance information. For example, at least one of the imaging units 12101 to 12104 may be a stereo camera including a plurality of imaging elements, or may be an imaging element having pixels for phase difference detection.

For example, the microcomputer 12051 determines a distance to each three-dimensional object in the imaging range 12111 to 12114 and a temporal change (relative speed with respect to the vehicle 12100) of the distance on the basis of the distance information obtained from the imaging units 12101 to 12104, and can thereby particularly extract a three-dimensional object which is the nearest three-dimensional object on a traveling path of the vehicle 12100 and is traveling at a predetermined speed (for example, 0 km/h or more) in substantially the same direction as the vehicle 12100 as a preceding vehicle. Furthermore, the microcomputer 12051 can set an inter-vehicle distance to be secured in advance in front of the preceding vehicle, and can perform automatic brake control (including following stop control), automatic acceleration control (including following start control), and the like. In this way, it is possible to perform cooperative control aiming at, for example, automatic driving that autonomously travels without depending on driver's operation.

For example, the microcomputer 12051 classifies three-dimensional object data related to a three-dimensional object into a two-wheeled vehicle, a regular vehicle, a large vehicle, a pedestrian, and another three-dimensional object such as a telegraph pole on the basis of the distance information obtained from the imaging units 12101 to 12104 and extracts data, and can use the extracted data for automatic avoidance of an obstacle. For example, the microcomputer 12051 identifies an obstacle around the vehicle 12100 as an obstacle that a driver of the vehicle 12100 can see and an obstacle that is difficult to see. Then, the microcomputer 12051 judges a collision risk indicating a risk of collision with each obstacle. When the collision risk is higher than a set value and there is a possibility of collision, the microcomputer 12051 can perform driving assistance for avoiding collision by outputting an alarm to a driver via the audio speaker 12061 or the display unit 12062, or performing forced deceleration or avoiding steering via the drive system control unit 12010.

At least one of the imaging units 12101 to 12104 may be an infrared camera for detecting an infrared ray. For example, the microcomputer 12051 can recognize a pedestrian by determining whether or not a pedestrian exists in imaged images of the imaging units 12101 to 12104. Such recognition of a pedestrian is performed by, for example, a procedure of extracting characteristic points in imaged images of the imaging units 12101 to 12104 as infrared cameras and a procedure of performing pattern matching processing on a series of characteristic points indicating an outline of an object and determining whether or not a pedestrian exists. If the microcomputer 12051 determines that a pedestrian exists in imaged images of the imaging units 12101 to 12104 and recognizes a pedestrian, the audio image output unit 12052 controls the display unit 12062 such that the display unit 12062 superimposes and displays a rectangular contour line for emphasis on the recognized pedestrian. In addition, the audio image output unit 12052 may control the display unit 12062 such that the display unit 12062 displays an icon or the like indicating a pedestrian at a desired position.

An example of the vehicle control system to which the technology according to the present disclosure can be applied has been described above.

Note that the embodiments of the present disclosure are not limited to the above-described embodiments, and various modifications can be made thereto without departing from the gist of the present disclosure.

The present disclosure can have the following configurations.

(1)

A solid-state imaging element constituted by many pixels, including:

a photoelectric conversion unit formed for each of the pixels and configured to convert incident light into a charge;

a charge storage unit configured to temporarily hold the converted charge; and a first light shielding unit formed between the pixels and having a predetermined length in a thickness direction of a substrate, in which the charge storage unit is formed below a cross portion where the first light shielding unit formed between pixels adjacent to each other in a longitudinal direction crosses the first light shielding unit formed between pixels adjacent to each other in a lateral direction.

(2)
The solid-state imaging element according to (1), further including a second light shielding unit covering a light incident surface side of the cross portion.

(3)
The solid-state imaging element according to (1) or (2), in which
the cross portion is formed in a columnar shape or a polygonal pillar shape.

(4)
The solid-state imaging element according to (1) or (2), in which
the cross portion is formed in a cylindrical shape or a polygonal tubular shape.

(5)
The solid-state imaging element according to (1), (2), or (4), in which
the charge storage unit is extended in a thickness direction of a substrate in a tube of the cross portion formed in a tubular shape.

(6)
The solid-state imaging element according to any one of (1) to (5), in which
the first light shielding unit and the cross portion are formed individually at different etching rates.

(7)
The solid-state imaging element according to any one of (1) to (6), further including a TG transistor, an AMP transistor, a SEL transistor, an OFG transistor, and an RST transistor, in which
the charge storage unit and a source of the RST transistor are integrally formed.

(8)
The solid-state imaging element according to any one of (1) to (7), further including an FBEN transistor for suppressing reset noise.

(9)
The solid-state imaging element according to (7) or (8), in which
a drain of the AMP transistor and a drain of the RST transistor share a wire and are connected to VDD.

(10)
The solid-state imaging element according to any one of (1) to (9), further including a moth eye structure unit for irregularly reflecting incident light to the photoelectric conversion unit.

(11)
The solid-state imaging element according to any one of (1) to (10), in which
in the first light shielding unit, lengths in a planar direction of a substrate in adjacent pixel regions are different from each other.

(12)
The solid-state imaging element according to any one of (1) to (11), in which
in the first light shielding unit, lengths in a thickness direction of a substrate in adjacent pixel regions are different from each other.

(13)
The solid-state imaging element according to any one of (1) to (12), in which
the photoelectric conversion unit of one pixel has a different volume from the photoelectric conversion unit of a pixel adjacent thereto.

(14)
The solid-state imaging element according to any one of (1) to (13), in which
the pixel includes at least a first pixel sensitive to light having a first wavelength, a second pixel sensitive to a second wavelength longer than the first wavelength, and a third pixel sensitive to a third wavelength longer than the second wavelength.

(15)
The solid-state imaging element according to (14), in which
in the first light shielding unit formed between the first or second pixel and the third pixel, the length in a planar direction of a substrate in a region of the third pixel is longer than that in a region of the first or second pixel.

(16)
The solid-state imaging element according to (14) or (15), in which
in the first light shielding unit formed between the first or second pixel and the third pixel, the length in a thickness direction of a substrate in a region of the third pixel is longer than that in a region of the first or second pixel.

(17)
The solid-state imaging element according to any one of (14) to (16), in which
the photoelectric conversion unit of the third pixel has a smaller volume than the photoelectric conversion unit of the first or second pixel.

(18)
The solid-state imaging element according to any one of (14) to (17), in which
the charge storage unit formed between the first or second pixel and the third pixel is formed at a position close to the first or second pixel side.

(19)
The solid-state imaging element according to any one of (14) to (18), in which
the charge storage unit is shared by a plurality of pixels.

(20)
An electronic device having a solid-state imaging element constituted by many pixels mounted thereon, in which
the solid-state imaging element includes:
a photoelectric conversion unit formed for each of the pixels and configured to convert incident light into a charge;
a charge storage unit configured to temporarily hold the converted charge; and
a first light shielding unit formed between the pixels and having a predetermined length in a thickness direction of a substrate, and
the charge storage unit is formed below a cross portion where the first light shielding unit formed between pixels adjacent to each other in a longitudinal direction crosses the first light shielding unit formed between pixels adjacent to each other in a lateral direction.

REFERENCE SIGNS LIST

11 Si substrate
12 Color filter
13 PD
14 FD
15 Light shielding cover
16 Light shielding wall
21 Cross portion
22 Light shielding cover 31 Element isolating portion
32 Vertical transistor
131 Moth eye structure unit
141 VG electrode

The invention claimed is:

1. A solid-state imaging element, comprising:
   a plurality of pixels;
   a photoelectric conversion unit for each pixel of the plurality of pixels, wherein the photoelectric conversion unit is configured to convert incident light into a charge;
   a charge storage unit configured to temporarily hold the charge;
   a first light shielding unit between the plurality of pixels and having a determined length in a thickness direction of a substrate, wherein
   the charge storage unit is below a cross portion where the first light shielding unit between a plurality of first pixels adjacent to each other in a longitudinal direction crosses the first light shielding unit between a plurality of second pixels adjacent to each other in a lateral direction; and
   a second light shielding unit covering a light incident surface side of the cross portion.

2. The solid-state imaging element according to claim 1, wherein
   the cross portion is in a columnar shape or a polygonal pillar shape.

3. The solid-state imaging element according to claim 1, wherein
   the cross portion is in a cylindrical shape or a polygonal tubular shape.

4. The solid-state imaging element according to claim 3, wherein
   the charge storage unit is extended in the thickness direction of the substrate in a tube of the cross portion formed in a tubular shape.

5. The solid-state imaging element according to claim 1, wherein
   the first light shielding unit and the cross portion are formed individually at different etching rates.

6. The solid-state imaging element according to claim 1, further comprising:
   a TG transistor;
   an AMP transistor;
   a SEL transistor;
   an OFG transistor; and
   an RST transistor, wherein
   the charge storage unit and a source of the RST transistor are integrally formed.

7. The solid-state imaging element according to claim 6, further comprising a feedback enable (FBEN) transistor configured to suppress reset noise.

8. The solid-state imaging element according to claim 6, wherein
   a drain of the AMP transistor and a drain of the RST transistor share a wire and are connected to a VDD.

9. The solid-state imaging element according to claim 1, further comprising a moth eye structure unit configured to irregularly reflect the incident light to the photoelectric conversion unit.

10. The solid-state imaging element according to claim 1, wherein
    in the first light shielding unit, lengths in a planar direction of the substrate in adjacent pixel regions are different from each other.

11. The solid-state imaging element according to claim 1, wherein
    in the first light shielding unit, lengths in the thickness direction of the substrate in adjacent pixel regions are different from each other.

12. The solid-state imaging element according to claim 1, wherein
    the photoelectric conversion unit of a first pixel of the plurality of pixels has a different volume from the photoelectric conversion unit of a second pixel of the plurality of pixels, and
    the second pixel is adjacent to the first pixel.

13. The solid-state imaging element according to claim 1, wherein
    the plurality of pixels includes:
    at least a first pixel sensitive to light having a first wavelength;
    a second pixel sensitive to a second wavelength longer than the first wavelength; and
    a third pixel sensitive to a third wavelength longer than the second wavelength.

14. The solid-state imaging element according to claim 13, wherein
    in the first light shielding unit between the first pixel or the second pixel and the third pixel, a length in a planar direction of the substrate in a region of the third pixel is longer than that in a region of the first pixel or the second pixel.

15. The solid-state imaging element according to claim 13, wherein
    in the first light shielding unit between the first pixel or the second pixel and the third pixel, a length in the thickness direction of the substrate in a region of the third pixel is longer than that in a region of the first pixel or the second pixel.

16. The solid-state imaging element according to claim 13, wherein
    the photoelectric conversion unit of the third pixel has a smaller volume than the photoelectric conversion unit of the first pixel or the second pixel.

17. The solid-state imaging element according to claim 13, wherein
    the charge storage unit between the first pixel or the second pixel and the third pixel is at a position closer to the first pixel or the second pixel than the third pixel.

18. The solid-state imaging element according to claim 1, wherein the charge storage unit is shared by the plurality of pixels.

19. An electronic device, comprising:
    a solid-state imaging element, wherein the solid-state imaging element comprises:
    a plurality of pixels;
    a photoelectric conversion unit for each pixel of the plurality of pixels, wherein the photoelectric conversion unit is configured to convert incident light into a charge;
    a charge storage unit configured to temporarily hold the charge;
    a first light shielding unit between the plurality of pixels and having a determined length in a thickness direction of a substrate, wherein the charge storage unit is below a cross portion where the first light shielding unit between a plurality of first pixels adjacent to each other in a longitudinal direction crosses the first light shielding unit between a plurality of second pixels adjacent to each other in a lateral direction; and a second light shielding unit covering a light incident surface side of the cross portion.

\* \* \* \* \*